(12) United States Patent
Park et al.

(10) Patent No.: US 11,610,639 B2
(45) Date of Patent: Mar. 21, 2023

(54) NON-VOLATILE MEMORY DEVICE, STORAGE DEVICE HAVING THE SAME, AND READING METHOD THEREOF

(71) Applicant: SAMSUNG ELECTRONICS CO., LTD., Suwon-si (KR)

(72) Inventors: Eunhyang Park, Daegu (KR); Jinyoung Kim, Seoul (KR); Jisang Lee, Iksan-si (KR); Sehwan Park, Yongin-si (KR); Ilhan Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 17/336,378

(22) Filed: Jun. 2, 2021

(65) Prior Publication Data
US 2022/0139483 A1  May 5, 2022

(30) Foreign Application Priority Data
Oct. 30, 2020 (KR) .................. 10-2020-0143249

(51) Int. Cl.
| | |
|---|---|
| *G11C 16/26* | (2006.01) |
| *G11C 29/42* | (2006.01) |
| *G11C 29/44* | (2006.01) |
| *G11C 16/34* | (2006.01) |
| *G11C 16/04* | (2006.01) |
| G11C 29/12 | (2006.01) |

(52) U.S. Cl.
CPC .......... *G11C 29/42* (2013.01); *G11C 16/0433* (2013.01); *G11C 16/26* (2013.01); *G11C 16/3495* (2013.01); *G11C 29/44* (2013.01); G11C 2029/1202 (2013.01); G11C 2029/1204 (2013.01)

(58) Field of Classification Search
CPC ..... G11C 29/42; G11C 16/0433; G11C 16/26; G11C 16/3495; G11C 29/44; G11C 2029/1202; G11C 2029/1204; G11C 11/5642; G11C 16/0483; G11C 16/32; G11C 29/028; G11C 29/52; G11C 16/08; G06F 3/0659; G06F 3/0679; G06F 11/1048
USPC ....................... 365/185.09, 185.24
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,536,970 B2 | 1/2017 | Seol et al. | |
| 10,043,575 B2 | 8/2018 | Pignatelli et al. | |
| 10,090,046 B2 | 10/2018 | Park et al. | |
| 10,120,589 B2 | 11/2018 | Jung | |
| 10,373,693 B2 | 8/2019 | Cha et al. | |
| 10,381,090 B2 | 8/2019 | Oh et al. | |

(Continued)

*Primary Examiner* — Michael T Tran
(74) *Attorney, Agent, or Firm* — Volentine, Whitt & Francos, PLLC

(57) ABSTRACT

A reading method for a non-volatile memory device, includes performing a normal read operation using a default read level in response to a first read command; and performing a read operation using a multiple on-chip valley search (OVS) sensing operation in response to a second read command, when read data read in the normal read operation are uncorrectable.

19 Claims, 19 Drawing Sheets

(56) References Cited

U.S. PATENT DOCUMENTS

| | | |
|---|---|---|
| 10,559,362 B2 | 2/2020 | Shin et al. |
| 10,607,708 B2 | 3/2020 | Oh et al. |
| 10,629,259 B2 | 4/2020 | Jang |
| 2018/0204624 A1* | 7/2018 | Yoon .................... G11C 29/028 |
| 2019/0108092 A1 | 4/2019 | Lee |
| 2020/0098436 A1 | 3/2020 | Kim et al. |
| 2020/0152276 A1 | 5/2020 | Shin et al. |
| 2020/0159464 A1* | 5/2020 | Park ................... H03M 13/1111 |
| 2020/0211656 A1 | 7/2020 | Oh et al. |
| 2020/0286545 A1 | 9/2020 | Yoon |
| 2022/0005539 A1 | 1/2022 | Kim et al. |

* cited by examiner

| PB Init | BL Prech | Multiple OVS Sensing | Dump |

FIG. 8

NON-VOLATILE MEMORY DEVICE, STORAGE DEVICE HAVING THE SAME, AND READING METHOD THEREOF

CROSS-REFERENCE TO RELATED APPLICATION(S)

A claim of priority is made to Korean Patent Application No. 10-2020-0143249 filed on Oct. 30, 2020 in the Korean Intellectual Property Office, the entirety of which is hereby incorporated by reference.

BACKGROUND

The present disclosure relates to non-volatile memory devices, storage devices including such non-volatile memory devices, and methods of reading data from such non-volatile memory devices.

In general, a storage device may include an error correction code (ECC) circuit that generates an error correction code during a write operation, and the storage device may correct an error in data with reference to the error correction code during a read operation. However, there may be a case in which the degree of deterioration of memory cells in a storage device is severe, so that correction by an ECC circuit is not possible. In such a case, a read retry operation using a sensing technique that is different from a normal read operation may be performed.

SUMMARY

Embodiments of the inventive concepts provide a non-volatile memory device that helps prevent a read error due to noise, a storage device having the same, and a reading method thereof.

Embodiments of the inventive concepts provide a non-volatile memory device performing OVS sensing, a storage device having the same, and a reading method thereof.

Embodiments of the inventive concepts provide a non-volatile memory device including a plurality of memory blocks, each of the memory blocks including at least two strings between respective bitlines and a common source line, wherein each of the at least two strings includes at least one string select transistor, a plurality of memory cells, and at least one ground select transistor connected in series between a bitline from among the bitlines and the common source line, and wherein the at least one string select transistor has a gate connected to a string select line, the plurality of memory cells receive a wordline voltage from wordlines, and the at least one ground select transistor has a gate connected to a ground select line; and a control logic circuit that performs a multiple on-chip valley search (OVS) sensing operation to identify states of the plurality of memory cells. The multiple OVS sensing operation including at least two OVS sensing operations with respect to memory cells from among the plurality of memory cells connected to a wordline from among the wordlines of a selected memory block from among the plurality of memory blocks in response to an address, during a read operation.

Embodiments of the inventive concepts also provide a reading method for a non-volatile memory device including a plurality of memory cells and a control logic circuit. The reading method including performing, by the control logic circuit, a normal read operation on memory cells from among the plurality of memory cells using a default read level in response to a first read command; and performing, by the control logic circuit, a read operation on the memory cells from among the plurality of memory cells using a multiple on-chip valley search (OVS) sensing operation in response to a second read command, when read data read from the memory cells from among the plurality of memory cells during the normal read operation are uncorrectable.

Embodiments of the inventive concepts further provide a storage device including at least one non-volatile memory device including a plurality of memory cells; and a controller having control pins and that provides a command latch enable (CLE) signal, an address latch enable (ALE) signal, a chip enable (CE) signal, a write enable (WE) signal, a read enable (RE) signal, and a DQS signal to the at least one non-volatile memory device, and reads data from memory cells from among the plurality of memory cells of the at least one non-volatile memory. The at least one non-volatile memory device performs a multiple on-chip valley search (OVS) sensing operation on the memory cells from the plurality of memory cells by latching an OVS command at an edge of the WE signal according to the CLE signal and the ALE signal, and outputs detection case information corresponding to the multiple OVS sensing operation to the controller.

Embodiments of the inventive concepts still further provide a non-volatile memory device including a memory cell region having a first metal pad; and a peripheral circuit region having a second metal pad, the memory cell region and the peripheral circuit region vertically connected through the first metal pad and the second metal pad. The memory cell region includes a memory cell array including a plurality of memory blocks having a plurality of memory cells connected to a plurality of wordlines and a plurality of bitlines. The peripheral circuit region includes a row decoder that selects a wordline among the plurality of wordlines; a page buffer circuit having a plurality of page buffers connected to the plurality of bitlines; and a control logic circuit having an on-chip valley search (OVS) circuit, and that receives a command latch enable (CLE) signal, an address latch enable (ALE) signal, a chip enable (CE) signal, a write enable (WE) signal, a read enable (RE) signal, and a DQS signal through control pins to latch a command or an address at an edge of the WE signal according to the CLE signal and the ALE signal, and to perform a multiple OVS sensing operation on memory cells of the memory cell region using the OVS circuit.

Embodiments of the inventive concepts also provide a controller including control pins providing a command latch enable (CLE) signal, an address latch enable (ALE) signal, a chip enable (CE) signal, a write enable (WE) signal, a read enable (RE) signal, and a DQS signal to at least one non-volatile memory device; an error correction code (ECC) circuit receiving data of a first read operation from the at least one non-volatile memory device, and performing error correction of the received data; a buffer memory including a first table storing a first offset level, a second table storing a second offset level, and a third table storing a history read level; and at least one processor that issues an on-chip valley search (OVS) command when the ECC circuit is unable to correct the received data, transmits the OVS command to the at least one non-volatile memory device to request a multiple OVS sensing operation, receives detection case information according to the multiple OVS sensing operation, determines the second offset level corresponding to the received detection case information using the second table, updates the history read level in the third table using the first offset level of the first table and the second offset level to provide an updated history read level, and requests a second read operation of the at least one non-volatile memory device using the updated history read level.

Embodiments of the inventive concepts still further provide a reading method for a storage device including a controller and at least one non-volatile memory device. The reading method includes requesting a normal read operation using a default read level from the at least one non-volatile memory device by the controller; entering, by the controller, a recovery code activating an on-chip valley search (OVS) mode of the at least one non-volatile memory device when read data read as a result of the normal read operation is uncorrectable; transmitting, by the controller, an OVS command to the at least one non-volatile memory device to perform a multiple OVS sensing operation; updating, by the controller, a history read level using detection case information according to the multiple OVS sensing operation, when the multiple OVS sensing operation passes; and releasing, by the controller, the recovery code to deactivate the OVS mode after the updating.

BRIEF DESCRIPTION OF DRAWINGS

The above and other aspects, features, and advantages of the inventive concepts will be more clearly understood from the following detailed description, taken in conjunction with the accompanying drawings, in which:

FIG. 8 illustrates a concept of a read operation using a multiple OVS sensing operation of a non-volatile memory device according to embodiments of the inventive concepts.

DETAILED DESCRIPTION

A non-volatile memory device according to embodiments of the inventive concepts, a storage device including the same, and a reading method such a non-volatile memory device may perform a multiple OVS sensing operation to increase accuracy of a sensing operation, and may reduce entry of a recovery code to improve overall system performance. In this case, details of an OVS sensing operation are described in US Patent Publication No. 2020-0286545, US Patent Publication No. 2020-0098436, U.S. Pat. Nos. 10,090,046, 10,559,362, 10,607,708, 10,629,259, which are incorporated herein by reference.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
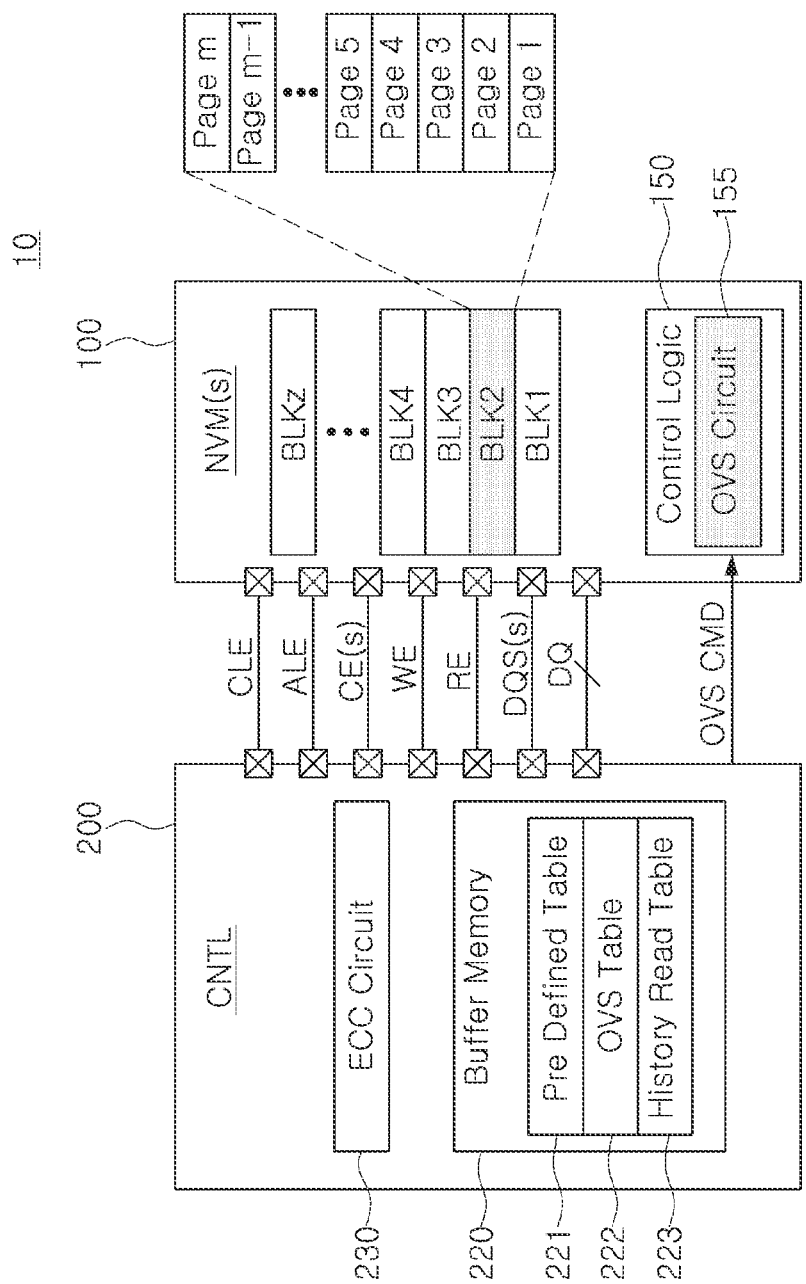
FIG. 1 illustrates a storage device according to embodiments of the inventive concepts.

FIG. 1 illustrates a storage device 10 according to embodiments of the inventive concepts. Referring to FIG. 1, storage device 10 includes at least one non-volatile memory device NVM(s) 100 and a controller CNTL 200.

The at least one non-volatile memory device 100 may be implemented to store data. The non-volatile memory device 100 may include for example NAND flash memory, vertical NAND flash memory, NOR flash memory, resistive random access memory (RRAM), phase-change memory (PRAM), magnetoresistive random access memory (MRAM), ferroelectric random access memory (FRAM), spin transfer torque random access memory (STT-RAM), or the like. Also, the non-volatile memory device 100 may be implemented to have a three-dimensional array structure.

In addition, the non-volatile memory device 100 may be implemented to include a plurality of memory blocks BLK1 to BLKz, where z is an integer equal to or greater than 2, and control logic 150. Each of the plurality of memory blocks BLK1 to BLKz may include a plurality of pages Page 1 to Page m, where m is an integer equal to or greater than 2. Each of the plurality of pages Page 1 to Page m may include a plurality of memory cells. Each of the plurality of memory cells may store at least one bit.

The control logic 150 may receive a command and an address from the controller CNTL 200, and may be implemented to perform an operation (a program operation, a read operation, an erase operation, or the like) corresponding to the received command in memory cells corresponding to the address.

In some embodiments, the control logic 150 may include a logic circuit and/or a processor configured to perform logic operations in response to executable instructions stored in a memory device for example. Also, the control logic 150 may include an OVS circuit 155.

The OVS circuit 155 may perform an on-chip valley search (OVS) sensing operation. In this case, the OVS sensing operation may include a first sensing operation that determines an OVS detection case based on a cell count, and a second sensing operation that changes and senses an actual development time according to the determined OVS detection case. The OVS circuit 155 may be implemented to store OVS detection information corresponding to a result of the OVS sensing operation. Such OVS detection information may include information (e.g., development time information) indicating an optimal scattered valley corresponding to a state.

In addition, the OVS circuit 155 may perform a multiple OVS sensing operation to increase accuracy of a sensing operation. In this case, the multiple OVS sensing operation may include at least two OVS sensing operations.

The controller CNTL 200 may be connected to the at least one non-volatile memory device 100 through a plurality of control pins transmitting control signals (e.g., a command latch enable (CLE) signal, an address latch enable (ALE) signal, a chip enable (CE) signal, a write enable (WE) signal, a read enable (RE) signal, and the like). Also, the controller CNTL 200 may be implemented to use the control signals (CLE, ALE, CE(s), WE, RE, or the like) to control the non-volatile memory device 100. For example, the non-volatile memory device 100 may latch a command (CMD) or an address (ADD) at an edge of the WE signal according to the CLE signal and the ALE signal, to perform a program operation, a read operation or an erase operation. Also, data signals DQ and data strobe signals DQS may be communicated between the controller 200 and the at least one memory device 100.

Also, the controller 200 may include a buffer memory 220 and an error correction code circuit (ECC) 230.

The buffer memory 220 may be implemented as volatile memory (e.g., static random access memory (SRAM), dynamic RAM (DRAM), synchronous RAM (SDRAM), and the like) or non-volatile memory (e.g., flash memory, phase-change RAM (PRAM), magnetoresistive RAM (MRAM), resistive RAM (ReRAM), ferroelectric RAM (FRAM), and the like). The buffer memory 220 may include a plurality of tables 221, 222, and 223.

A first table 221 (i.e., predefined table) may include first read voltage level offset information. In an embodiment, the first table 221 may include first read voltage level offset information corresponding to elapsed program time. In an embodiment, the first table 221 may include first read voltage level offset information corresponding to various deterioration information (e.g., temperature, program/erase cycle, read cycle, an open wordline case, and the like) in addition to the elapsed program time.

A second table 222 (i.e., OVS table) may include second read voltage level offset information corresponding to OVS detection information corresponding to a detection case of an OVS sensing operation. In this case, the OVS detection information may be development time information corresponding to an optimal scattered valley. For example, the second read voltage level offset information may include read voltage level offset information corresponding to development time information in which an OVS sensing operation is performed. Therefore, the second table 222 may be a table in which OVS detection information is converted into read voltage level offset information.

A third table 223 (i.e., history read table) may include third read voltage level offset information related to a history read operation. In an embodiment, the third read voltage level offset information may be determined using the first read voltage level offset information and the second read voltage level offset information. In this case, the third read voltage level offset information may include information on an optimal read level for performing the history read operation. Details of a history read operation are described in U.S. Pat. Nos. 10,120,589 and 10,373,693, which are incorporated herein by reference.

The ECC circuit 230 may be implemented to generate an error correction code during a program operation, and to use the error correction code during a read operation to recover data. For example, the ECC circuit 230 may generate an error correction code (ECC) for correcting a fail bit or an error bit of data received from the non-volatile memory device 100. The ECC circuit 230 may perform error correction encoding of data provided to the non-volatile memory device 100, to form data to which a parity bit is added. The parity bit may be stored in the non-volatile memory device 100. In addition, the ECC circuit 230 may perform error correction decoding on the data output from the non-volatile memory device 100. The ECC circuit 230 may correct an error using the parity bit. The ECC circuit 230 may correct an error using coded modulation such as for example a low density parity check (LDPC) code, a BCH code, a turbo code, a Reed-Solomon code, a convolution code, a recursive systematic code (RSC), a trellis-coded modulation (TCM), a block coded modulation (BCM), or the like.

When it is impossible for the ECC circuit 230 to perform error correction, a read retry operation may be performed. In an embodiment, the read retry operation may include a multiple OVS sensing operation. In another embodiment, the read retry operation may include a multiple OVS sensing operation reflecting the first table 221.

A storage device 10 according to embodiments of the inventive concepts may perform a normal sensing operation before error correction is impossible, and may perform a multiple OVS sensing operation for read retry after error correction is impossible. A storage device 10 of the inventive concepts may determine a final detection case using a plurality of OVS sensing operations, to minimize determination error of an OVS sensing operation due to noise. As a result, a storage device 10 of the inventive concepts may improve reliability of data and reduce entry of additional recovery codes, to thus improve overall system performance.

Figure 2:
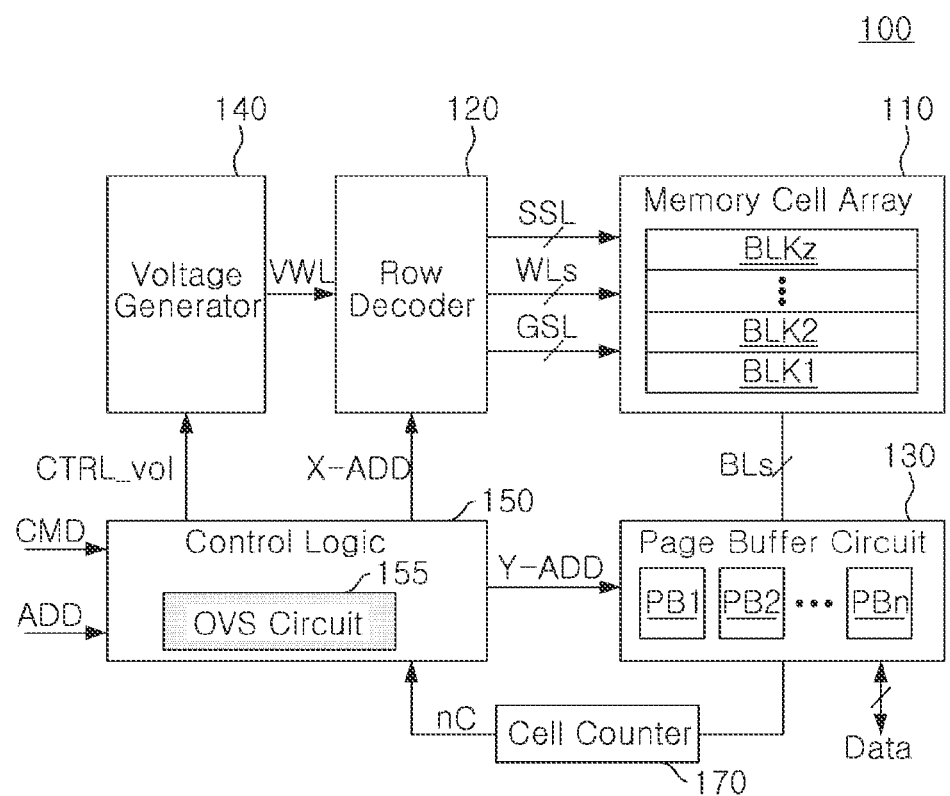
FIG. 2 illustrates a non-volatile memory device of FIG. 1.

FIG. 2 illustrates the non-volatile memory device 100 of FIG. 1. Referring to FIG. 2, the non-volatile memory device 100 includes memory cell array 110, row decoder 120, page buffer circuit 130, voltage generator 140, control logic 150, and cell counter 170. Although not illustrated in FIG. 2, the non-volatile memory device 100 may further include a memory interface circuit. In addition, the non-volatile memory device 100 may further include for example column logic, a pre-decoder, a temperature sensor, a command decoder, an address decoder, or the like.

The memory cell array 110 may be connected to the row decoder 120 through wordlines WLs, or select lines SSL and GSL. The memory cell array 110 may be connected to the page buffer circuit 130 through bitlines BLs. The memory cell array 110 may include a plurality of cell strings. Each channel of the cell strings may be formed in a vertical direction or a horizontal direction. Each of the cell strings may include a plurality of memory cells. In this case, the plurality of memory cells may be programmed, erased, or read by a voltage provided to the bitlines BLs or the wordlines WLs.

In general, a program operation may be performed on a page basis, and an erase operation may be performed on a block basis. In an embodiment, the memory cell array 110 may include a 3D memory cell array. In this case, the 3D memory cell array may include a plurality of NAND strings. Each of the plurality of NAND strings may include memory cells connected to wordlines vertically stacked on a substrate. Details of the memory cells are described in US patents, U.S. Pat. Nos. 7,679,133, 8,553,466, 8,654,587, 8,559,235, and 9,536,970. In an embodiment, the memory cell array 110 may include a 2D memory cell array, and the 2D memory cell array may include a plurality of NAND strings arranged in row and column directions.

The row decoder 120 may be implemented to select any one of the memory blocks BLK1 to BLKz of the memory cell array 110 in response to a row address X-ADD. The row decoder 120 may select any one of wordlines of a selected memory block in response to the row address X-ADD. The row decoder 120 may transfer a wordline voltage VWL corresponding to an operation mode to the wordlines of the selected memory block. During a program operation, the row decoder 120 may apply a programming voltage and a verify voltage to a selected wordline, and may apply a pass voltage to unselected wordlines. During a read operation, the row decoder 120 may apply a read voltage to a selected wordline, and may apply a read pass voltage to unselected wordlines.

The page buffer circuit 130 may include a plurality of page buffers PB1 to PBn, where n is an integer greater than or equal to 2. In this case, the plurality of page buffers PB1 to PBn may be respectively connected to the memory cells through bitlines BLs corresponding thereto. The page buffer circuit 130 may select at least one bitline among the bitlines BLs in response to a column address Y-ADD. The page buffer circuit 130 may operate as a write driver or a sense amplifier according to an operation mode. For example, during a program operation, the page buffer circuit 130 may apply a bitline voltage corresponding to data to be programmed to the selected bitline. During a read operation, the page buffer circuit 130 may sense data stored in a memory cell by sensing a current or voltage of a selected bitline.

Each of the plurality of page buffers PB1 to PBn may be implemented to perform sensing and latching for an OVS sensing operation. For example, each of the plurality of page buffers PB1 to PBn may perform a plurality of sensing operations to identify any one state stored in the selected memory cells under control of the control logic 150. In addition, after each of the plurality of page buffers PB1 to PBn stores data sensed by the plurality of sensing operations, any one data may be selected under the control of the control logic 150. For example, each of the plurality of page buffers PB1 to PBn may perform the plurality of sensing operations to identify the any one state. In addition, each of the plurality of page buffers PB1 to PBn may select or output optimal data, among a plurality of data, sensed according to the control of the control logic 150.

An input/output buffer circuit (not shown) may be included, and may provide data that is externally provided to the page buffer circuit 130. The input/output buffer circuit may provide a command CMD that is externally provided to the control logic 150. The input/output buffer circuit may provide an address ADD that is externally provided to the control logic 150 or the row decoder 120. In addition, the input/output buffer circuit may externally output data sensed and latched by the page buffer circuit 130. In an embodiment, the input/output buffer circuit may include an error correction code (ECC) circuit that internally performs an error correction function.

The voltage generator 140 may be implemented to generate various types of wordline voltages to be respectively applied to wordlines under control of the control logic 150 and a well voltage to be supplied to a bulk (e.g., well region) in which memory cells are formed. The wordline voltages respectively applied to the wordlines may include programming voltage, pass voltage, read voltage, read pass voltages, or the like.

The control logic 150 may be implemented to generally control various operations in the non-volatile memory device 100. The control logic 150 may output various control signals in response to a command CMD and/or an address ADD from the memory interface circuit. For example, the control logic 150 may output a voltage control signal CTRL_vol, a row address X-ADD, and a column address Y-ADD.

In addition, the control logic 150 may include an OVS circuit 155 that performs an OVS sensing operation. The OVS circuit 155 may control the page buffer circuit 130 and the voltage generator 140 to perform an OVS sensing operation.

The OVS circuit 155 may control the page buffer circuit 130 to perform a plurality of sensing operations to identify specific states of the selected memory cells. In addition, the OVS circuit 155 may control the plurality of page buffers PB1 to PBn to store sensing data respectively corresponding to a plurality of sensing results, in a plurality of latch sets provided in each of the plurality of page buffers PB1 to PBn. Also, the OVS circuit 155 may perform a process for selecting optimal data among a plurality of sensed data. In order to select the optimal data, the OVS circuit 155 may refer to a count result nC provided from the cell counter 170. For example, the OVS circuit 155 may control the page buffer circuit 130 to select and output a read result closest to a scattered valley among the plurality of sensing results.

In addition, the OVS circuit 155 may store development time information corresponding to the OVS sensing operation. The OVS circuit 155 may output the stored development time information as OVS detection information to the controller 200. In an embodiment, the OVS detection information may be output using a UIB-out, may be output in response to a get feature command, or may be output in response to a status read command.

Further, the OVS circuit 155 may be implemented to perform a multiple OVS sensing operation. In an embodiment, the multiple OVS sensing operation may perform a plurality of OVS sensing operations to prevent an error in the OVS sensing operation due to noise, and as a result of the execution of the plurality of OVS sensing operations, a plurality of detection cases may be determined as a final detection case of the OVS sensing operation. In an embodiment, the multiple OVS sensing operation may perform a plurality of OVS sensing operations to prevent an error in the OVS sensing operation due to noise, may change a read level after the first OVS sensing operation, and may determine a final detection case according to a result of the OVS sensing operation.

The cell counter 170 counts the number of memory cells corresponding to a specific threshold voltage range from data sensed by the page buffer circuit 130. For example, the cell counter 170 may process data respectively sensed in the plurality of page buffers PB1 to PBn, to count the number of memory cells having a threshold voltage in a specific threshold voltage range, and may provide the count result nC to the control logic 150. In some embodiments cell counter 170 may be disposed in the control logic 150.

A non-volatile memory device 100 according to embodiments of the inventive concepts may perform a multiple OVS sensing operation, to reduce a misjudgment of an OVS sensing operation due to noise and thus secure reliability of a read operation.

Figure 3A:
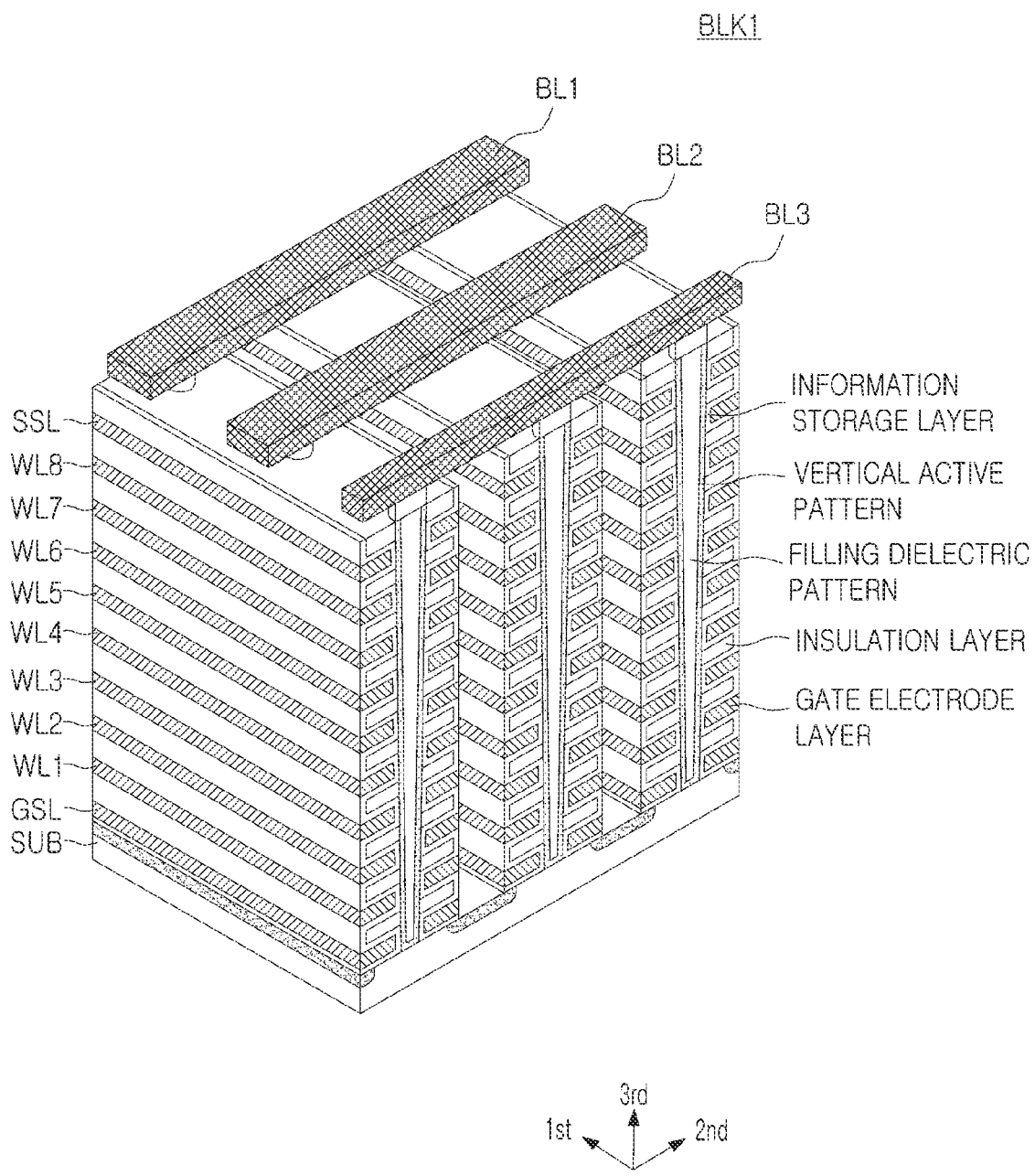
FIG. 3A illustrates a memory block according to embodiments of the inventive concepts.

FIG. 3A illustrates a memory block according to embodiment of the inventive concepts. Referring to FIG. 3A, a memory block BLK1 may be formed in a direction (i.e., the third direction) perpendicular to an upper surface of a substrate SUB. An n+ doped region may be formed on the substrate SUB. Gate electrode layers and insulation layers may be alternately deposited on the substrate SUB. An information storage layer may be formed between the gate electrode layers and the insulation layers. When the gate electrode layers and the insulation layers are vertically patterned, a pillar having a V-shape may be formed. The pillar may pass through the gate electrode layers and the insulation layers, to be connected to the substrate SUB. An insulating material such as silicon oxide may be formed in the pillar as a filling dielectric pattern. A channel semiconductor may be formed outside the pillar as a vertical active pattern.

The gate electrode layers of the memory block BLK1 may be respectively connected to a ground select line GSL, a plurality of wordlines WL1 to WL8, and a string select line SSL. In addition, the pillars of the memory block BLK1 may be connected to a plurality of bitlines BL1 to BL3. In FIG. 3A, memory block BLK1 is illustrated as having two (2) select lines GSL and SSL, eight (8) wordlines WL1 to WL8, and three (3) bitlines BL1 to BL3, but the inventive concepts are not limited thereto and the memory block BLK1 may have more than two select lines GSL and SSL and a different number of word lines WL.

Figure 3B:
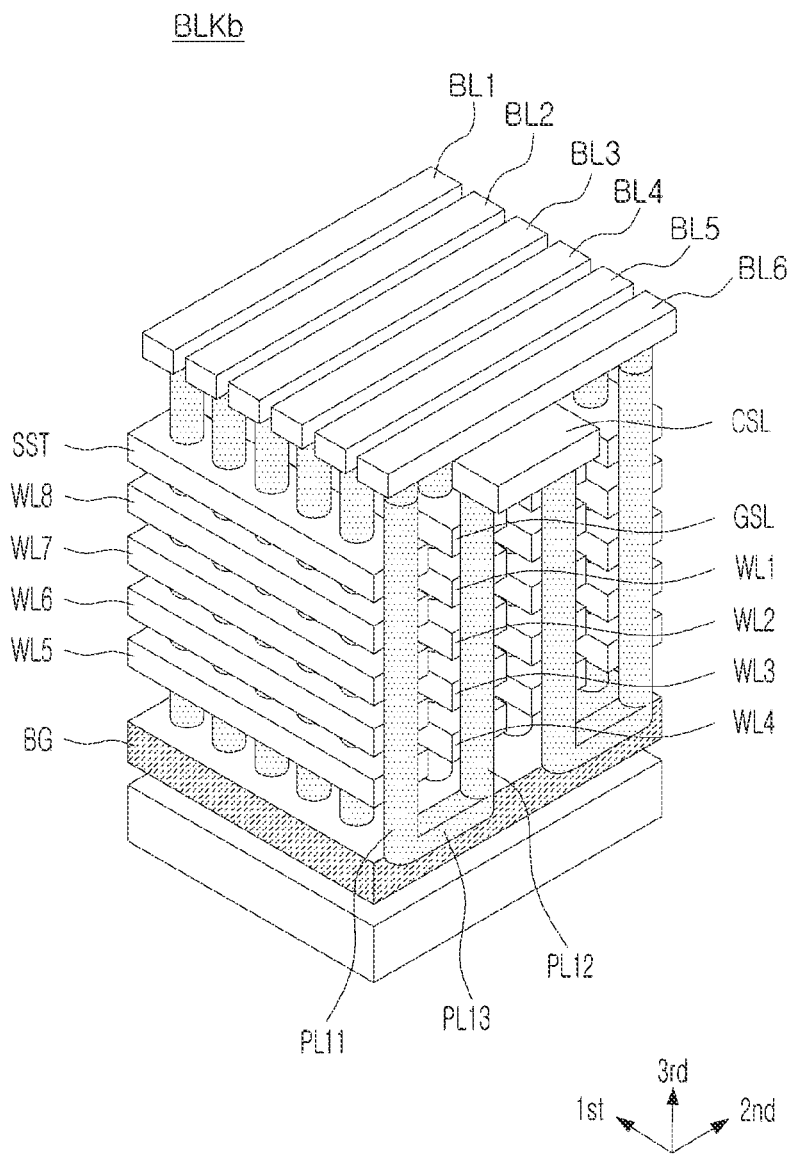
FIG. 3B illustrates a memory block according to other embodiments of the inventive concepts.

FIG. 3B illustrates a memory block according to other embodiments of the inventive concepts. Referring to FIG. 3B, for convenience of description, memory block BLKb has four (4) layers of wordlines. Strings NS may include memory cells MC1 to MC8 connected in series, respectively. In this case, first upper ends of memory cells MC8 formed at word line WL8 may be connected to a string select transistor SST formed at string select line SSL, second upper ends of e memory cells MC1 formed at word line WL1 may be connected to a ground select transistor GST formed at ground select line GSL, and lower ends of memory cells MC5 and MC4 formed at word lines WL5 and WL4 may be connected to each other. Memory cells constituting the string NS may be formed by stacking on a plurality of semiconductor layers. Each of the strings NS may include a first pillar PL11, a second pillar PL12, and a pillar connection portion PL13 connecting the first pillar PL11 and the second pillar PL12. The first pillar PL11 may be connected to a bitline (for example, BL1) and the pillar connection portion PL13, and may be formed by passing through a string select line SSL and wordlines WL5 to WL8. The second pillar PL12 may be connected to a common source line CSL and the pillar connection portion PL13, and may be formed by passing through a ground select line GSL and wordlines WL1 to WL4. As illustrated in FIG. 3B, the string NS may be implemented to form a pillar having a U-shape. In an embodiment, a back-gate BG may be formed on a substrate, and the pillar connection portion PL13 may be implemented inside the back-gate BG. In an embodiment, the back-gate BG may exist in the block BLKb in common. The back-gate BG may have a structure separated from a back-gate of another block.

Figure 4:
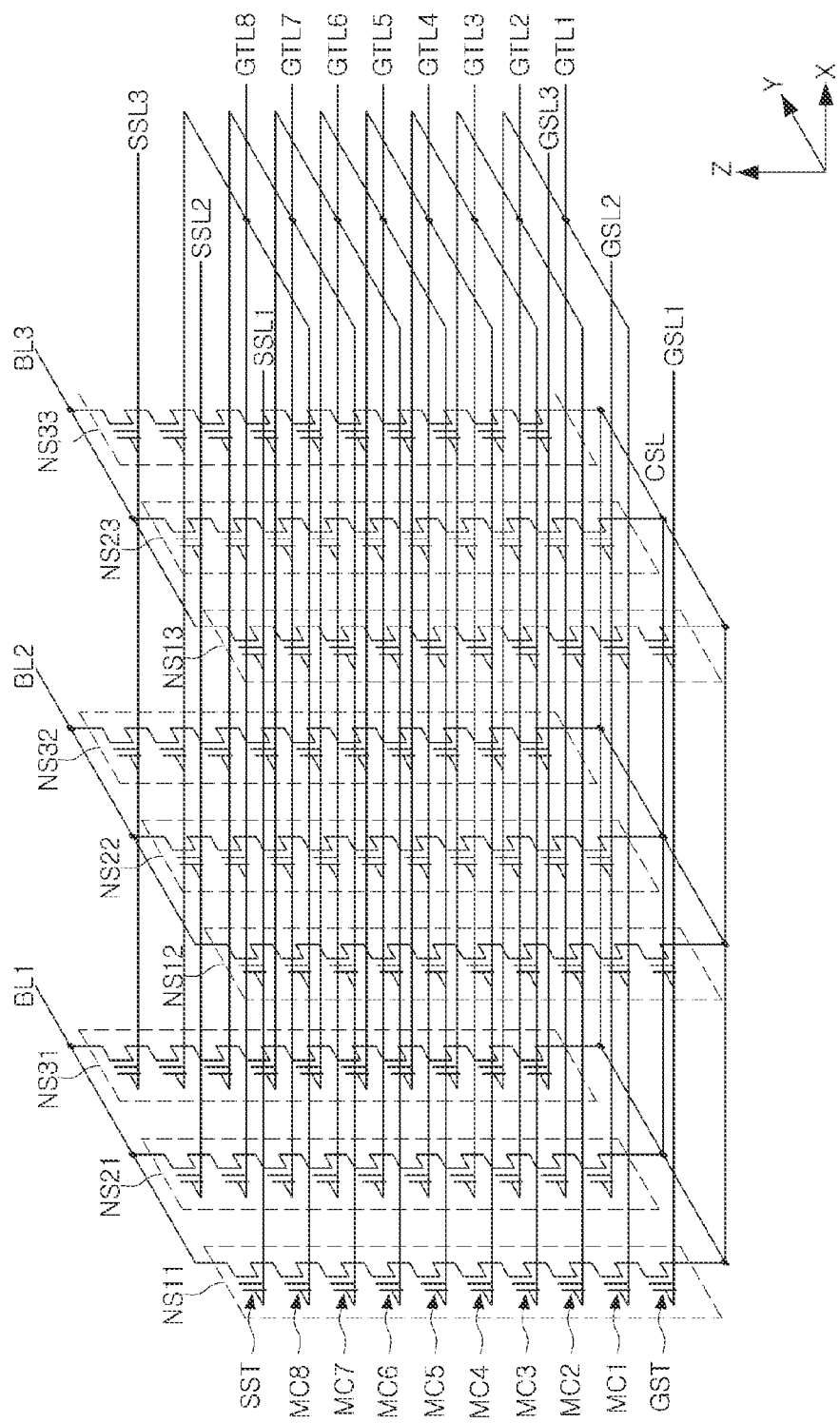
FIG. 4 illustrates a circuit diagram of a memory block according to embodiments of the inventive concepts.

FIG. 4 illustrates a circuit diagram of a memory block BLKi according to embodiments of the inventive concepts. A plurality of memory NAND strings included in the memory block BLKi may be formed in a direction perpendicular to a substrate (i.e., the Z-axis direction).

Referring to FIG. 4, a memory block BLKi may include a plurality of memory NAND strings NS11 to NS33 connected between bitlines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. In FIG. 4, each of the plurality of memory NAND strings NS11 to NS33 is illustrated to include eight (8) memory cells MC1, MC2, . . . , MC8. However, the inventive concepts are not limited thereto and more than one string select transistor SST, more than one ground select transistor GST and memory cells greater than or less than eight (8) in number may be included in each NAND string.

The string select transistors SST may be connected to string select lines SSL1, SSL2, and SSL3 corresponding thereto. The plurality of memory cells MC1, MC2, . . . , MC8 may be connected to gate lines GTL1, GTL2, GTL8 corresponding thereto, respectively. The gate lines GTL1, GTL2, GTL8 may correspond to wordlines, and some of the gate lines GTL1, GTL2, GTL8 may correspond to dummy wordlines. The ground select transistors GST may be connected to ground select lines GSL1, GSL2, and GSL3 corresponding thereto. The string select transistors SST may be connected to the bitlines BL1, BL2, and BL3 corresponding thereto, and the ground select transistors GST may be connected to the common source line CSL.

Wordlines (e.g., WL1) having the same height may be connected in common, and the ground select lines GSL1, GSL2, and GSL3 and the string select lines SSL1, SSL2, and SSL3 may be separated from each other. In FIG. 4, the memory block BLKi is illustrated to be connected to eight (8) gate lines GTL1, GTL2, GTL8 and three (3) bitlines BL1, BL2, BL3, but the inventive concepts are not limited thereto and the memory block BLKi may include different numbers of gate lines and bit lines other than shown.

Figure 5:
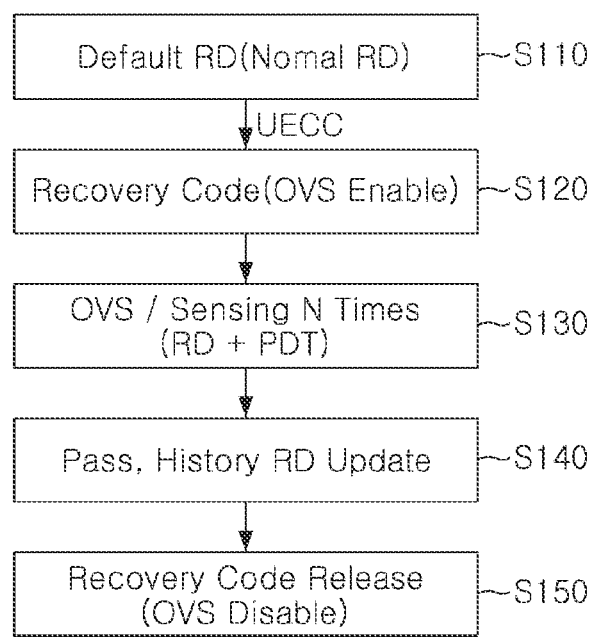
FIG. 5 illustrates a flowchart of a process of performing a read operation using OVS in a storage device according to embodiments of the inventive concepts.

FIG. 5 illustrates a flowchart of a process of performing a read operation using OVS in a storage device such as storage device 10 shown in FIG. 1 according to embodiments of the inventive concepts. In this case, a normal read operation (Normal RD) may be performed by controller 200 using a default read voltage level (S110). When error correction by the ECC circuit 230 is impossible in the normal read operation (UECC), a recovery code performing a read operation in a different manner may be entered by controller 200. In this case, an OVS mode may be activated (S120). A multiple OVS sensing operation (indicated as OVS/Sensing N Times) may be performed by non-volatile memory device 100 in the activated OVS mode (S130). As a result of the multiple OVS sensing operation, a read level RD may be determined according to a detection case. A read operation using the read level RD and a predefined table (PDT) 221 may be performed (S130).

When error correction of the read operation is possible, e.g., when the read operation passes, a history read table (HRT) 223 may be updated by controller 200. In this case, the read level corresponding to the detection case of the multiple OVS sensing operation may be reflected in the HRT 223 (S140).

Subsequently, the recovery code may be released, and the OVS mode may be deactivated (S150), as indicated by (OVS Disable). A normal read operation may be performed using the updated HRT 223.

A storage device 10 according to embodiments of the inventive concepts may use a detection case according to a multiple OVS sensing operation in a read operation, to minimize a sensing error due to noise. Further, a storage device 10 according to embodiments of the inventive concepts may reflect detection information according to the multiple OVS sensing operation to the HRT 223, to use an optimum read voltage level in the next read operation.

Figure 6:
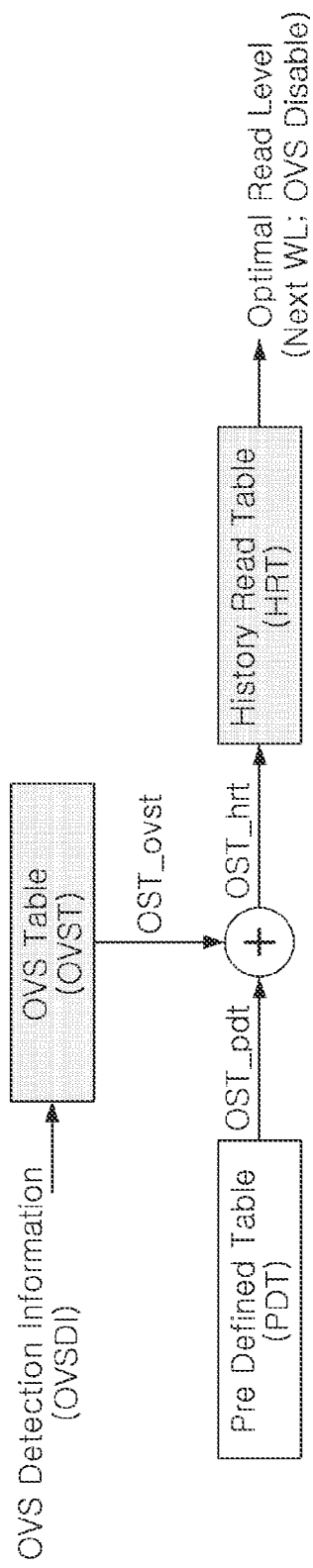
FIG. 6 conceptually illustrates a process of extracting an optimal read voltage level of a storage device according to embodiments of the inventive concepts.

FIG. 6 conceptually illustrates a process of extracting an optimal read voltage level of a storage device 10 according to embodiments of the inventive concepts. Referring to FIG. 6, a storage device 10 may update a history read table HRT 223 using a predefined table PDT 221 and an OVS table 222, to extract an optimum read voltage level.

OVS detection information (OVS DI) may include result information according to a multiple OVS sensing operation. A second read voltage level offset OST_ovst, corresponding to the OVS detection information, may be reflected (stored or updated) in the OVS table 222. Basically, a third read voltage level offset OST_hrt may be finally determined by adding the second read voltage level offset OST_ovst to a first read voltage level offset OST_pdt according to lapse of a program time. It should be understood that the third read voltage level offset OST_hrt is determined only by a simple addition of the first read voltage level offset OST_pdt and the second read voltage level offset OST_ovst. In addition, the third read voltage level offset OST_hrt may be added by applying a weight to each of the first and second read voltage level offsets OST_pdt and OST_ovst.

A storage device 10 according to embodiments of the inventive concepts may reflect (store or update) the second read voltage level offset OST_ovst according to an OVS sensing operation to the history read table HRT 223, to deactivate the OVS sensing operation (i.e., without applying a recovery code) and perform the read operation on the optimal read voltage level. Therefore, reliability of data of a read operation may be improved and entry of a recovery code may be reduced, to improve performance of the read operation.

Figure 7A:
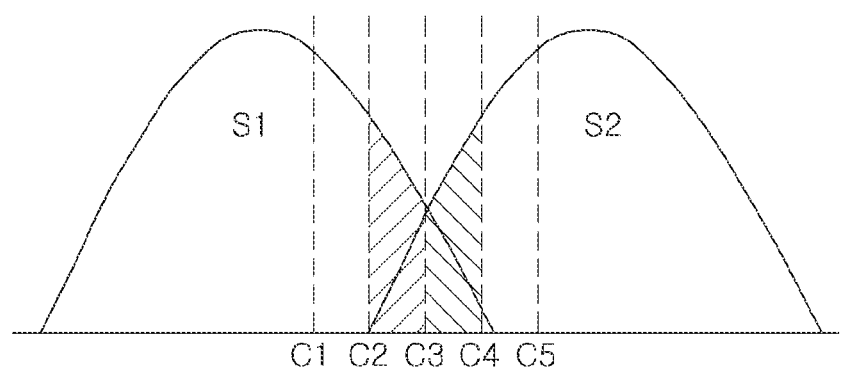
FIG. 7A conceptually illustrates different read voltages of scattered valleys for an OVS searching operation.
Figure 7B:
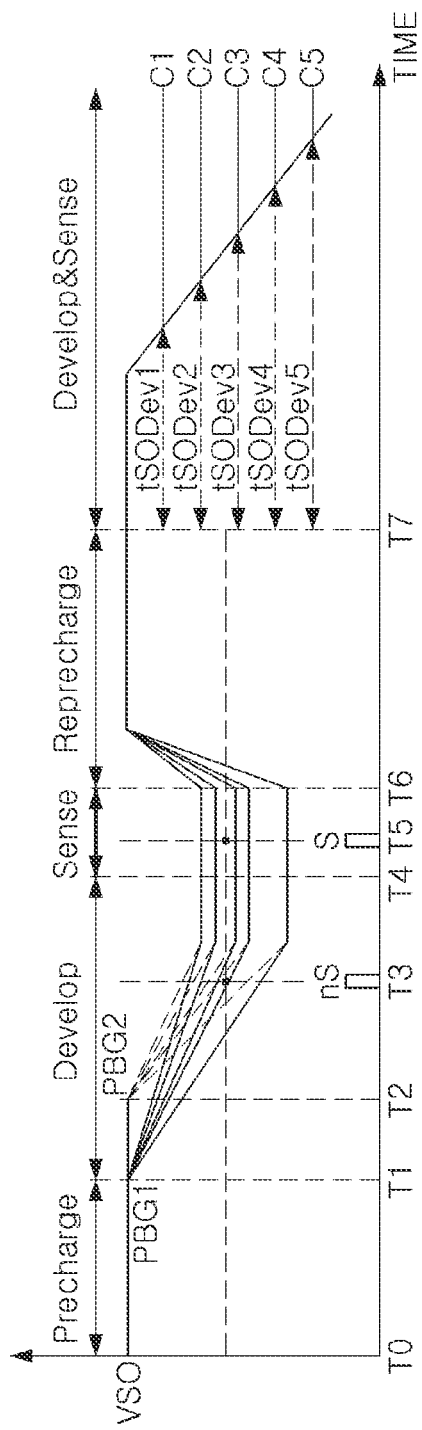
FIG. 7B conceptually illustrates development times for different read voltages of scattered valleys for an OVS searching operation.

FIGS. 7A and 7B conceptually illustrate different read voltages of scattered valleys and development times corresponding thereto. Referring to FIG. 7A, an OVS sensing operation for finding scattered valleys of states S1 and S2 may be performed by a plurality of sensing operations. In FIG. 7A the horizontal axis may represent read voltage and the vertical axis may represent the number of memory cells. In this case, the plurality of sensing operations may be simultaneously performed in each plurality of page buffer groups. Referring to FIG. 7B, an on-chip valley search (OVS) sensing operation may be performed by sequentially latching sensing nodes at the same points in time during different development periods in first page buffers PGB1 and second page buffers PGB2 from among the page buffers PB1 to PB2, to store sensing results.

A precharging operation may be performed from a point in time T0 to a point in time T1. For precharging, a first bitline and a first sensing node connected to each of the first page buffers PBG1 may be charged. When bitline set-up signals are activated, the first sensing node and the first bitline may be precharged to a specific level. When a first bitline set-up signal (not shown) is deactivated to a high level at a point in time T1, a precharging circuit of each of the first page buffers PBG1 may be turned off. In addition, when a second bitline set-up signal (not shown) is deactivated to a high level at a point in time T2 after a point T1, a precharging circuit of each of the second page buffers PBG2 may be turned off. In this case, a level of each sensing node of the first page buffers PBG1 and a level of each sensing node of the second page buffers PBG2 may be changed, depending on magnitude of current flowing to a corresponding bitline according to whether a memory cell is turned on or off.

As illustrated in FIG. 7B, each of the first page buffers PBG1 may precharge the first sensing nodes from the point in time T0 to the point in time T1, and may develop the first bitlines from the point in time T1 to a point in time T4. Each of the second page buffers PBG2 may precharge second sensing nodes from the point in time T0 to the point in time T1, and may develop second bitlines from the point in time T2, which may be later than the point in time T1, to the point in time T4.

A sensing operation may include a latch reset (nS) sensing operation performed at a point in time T3 and a latch set (S) sensing operation performed at a point in time T5. First cell count information may be calculated by using an on-cell count value of a latch reset (nS) sensing operation and an on-cell count value of a latch set (S) sensing operation in the first page buffers PGB1. In addition, second cell count information may be calculated by using an on-cell count value of a latch reset (nS) sensing operation and an on-cell count value of a latch set (S) sensing operation in the second page buffers PGB2. A detection case (one of C1 to C5) corresponding to an optimal read voltage level corresponding to the scattered valley may be determined, based on the first and second cell count information of the first sensing operation. Further, development times tSODev1 to tSODev5 of a second sensing operation corresponding to the determined detection case may be determined. The second sensing operation in FIG. 7B may include the Reprecharge operation and the Develop & Sense operation beginning at the point in time T6 and extending through the point in time T7 as shown.

FIG. 8 illustrates a concept of a read operation using a multiple OVS sensing operation of a non-volatile memory device 100 according to embodiments of the inventive concepts. Referring to FIG. 8, a read operation may include a page buffer initialization period PB Init, a bitline precharging period BL Prech, a multiple OVS sensing period, and a dump period Dump. In the multiple OVS sensing period, a first OVS sensing operation and a second OVS sensing operation may be performed.

Figure 9A:
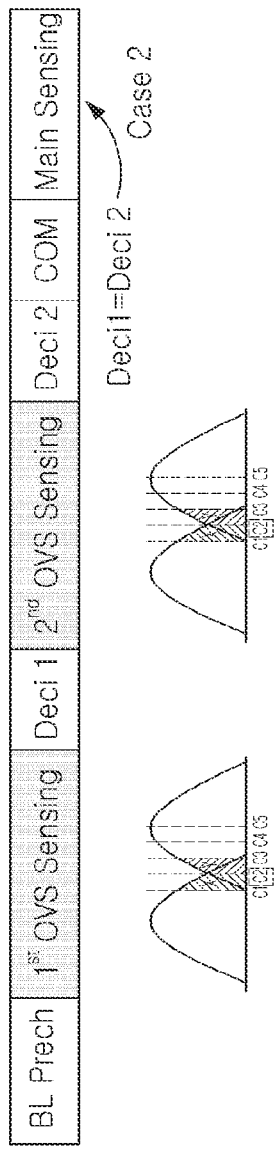
FIG. 9A illustrates a read operation using a multiple OVS sensing operation in which a result value of a first OVS sensing operation is identical to a second OVS sensing operation according to embodiments of the inventive concepts.
Figure 9B:
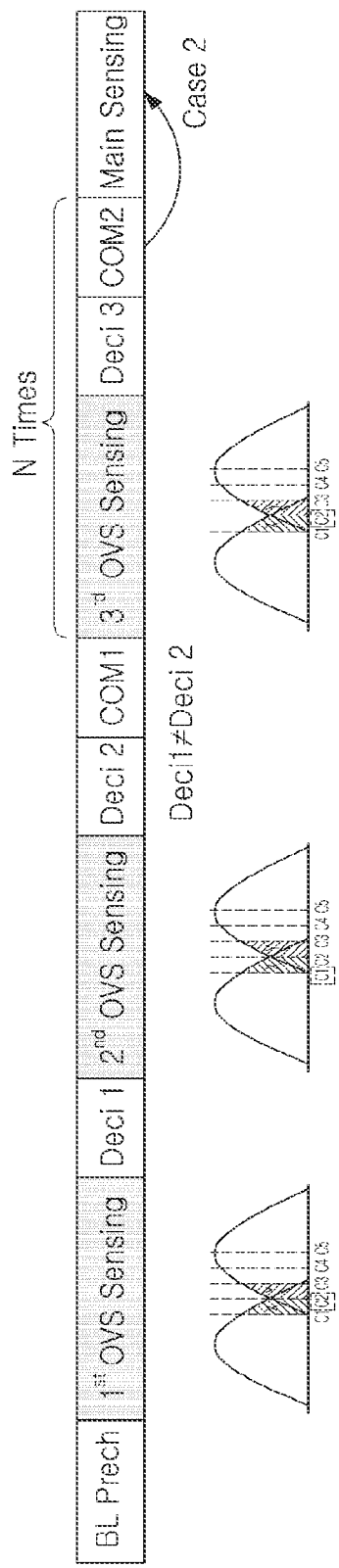
FIG. 9B illustrates a read operation using a multiple OVS sensing operation in which a result value of a first OVS sensing operation is different than a second OVS sensing operation according to embodiments of the inventive concepts.

FIGS. 9A and 9B illustrate a read operation using a multiple OVS sensing operation according to embodiments of the inventive concepts. In FIGS. 9A and 9B, the first and second determination values Deci 1 and Deci 2 may be cell counts provided from cell counter 170 shown in FIG. 2.

FIG. 9A illustrates a case in which a result value of a first OVS sensing operation is identical to a result value of a second OVS sensing operation. A precharging operation for a bitline may be performed in a bitline precharging period BL Prech. Then, in a first OVS sensing period, a first OVS sensing operation may be performed. Thereafter, in the first determination period, as illustrated in FIG. 9A, a first determination value Deci 1 of the first OVS sensing operation may indicate a second case C2. Then, in a second OVS sensing period, a second OVS sensing operation may be performed. Thereafter, in the second determination period, as illustrated in FIG. 9A, a second determination value Deci 2 of the second OVS sensing operation may indicate the second case C2.

Thereafter, in a comparison period COM, it may be determined whether the first determination value Deci 1 is identical to the second determination value Deci 2. When the first determination value Deci 1 is identical to the second determination value Deci 2, a main sensing operation may be performed using a development time or a voltage level corresponding to the second case C2 in a main sensing period.

FIG. 9B illustrates a case in which a result value of a first OVS sensing operation is different from a result value of a second OVS sensing operation. As illustrated in FIG. 9B, in a first determination period a first determination value Deci 1 of a first OVS sensing operation may indicate a second case C2, and in a second determination period a second determination value Deci 2 of a second OVS sensing operation may indicate a first case C1. Since a situation in which sensing accuracy is deteriorated occurs in the second determination period, it is assumed that the second determination value Deci 2 indicates that the second case C2 is an optimal valley, but is determined as the first case C1.

Thereafter, it may be determined whether the first determination value Deci 1 is identical to the second determination value Deci 2 in a first comparison period COM1. When the first determination value Deci 1 is not identical to the second determination value Deci 2, a third OVS sensing operation may be performed. In this case, the third OVS sensing operation may be repeated N times (where N is an integer equal to or greater than 2). A case (e.g., C2) corresponding to a final scattered valley may be determined using a plurality of third determination values Deci3 in the second comparison period COM2. Thereafter, a main sensing operation may be performed using a development time or a voltage level corresponding to the case (e.g., C2) determined in a main sensing period.

In an embodiment, a method of determining a case from the third decision values Deci3 may use a majority voting method. It should be understood that the case determination method of the inventive concepts is not limited thereto.

Figure 10:
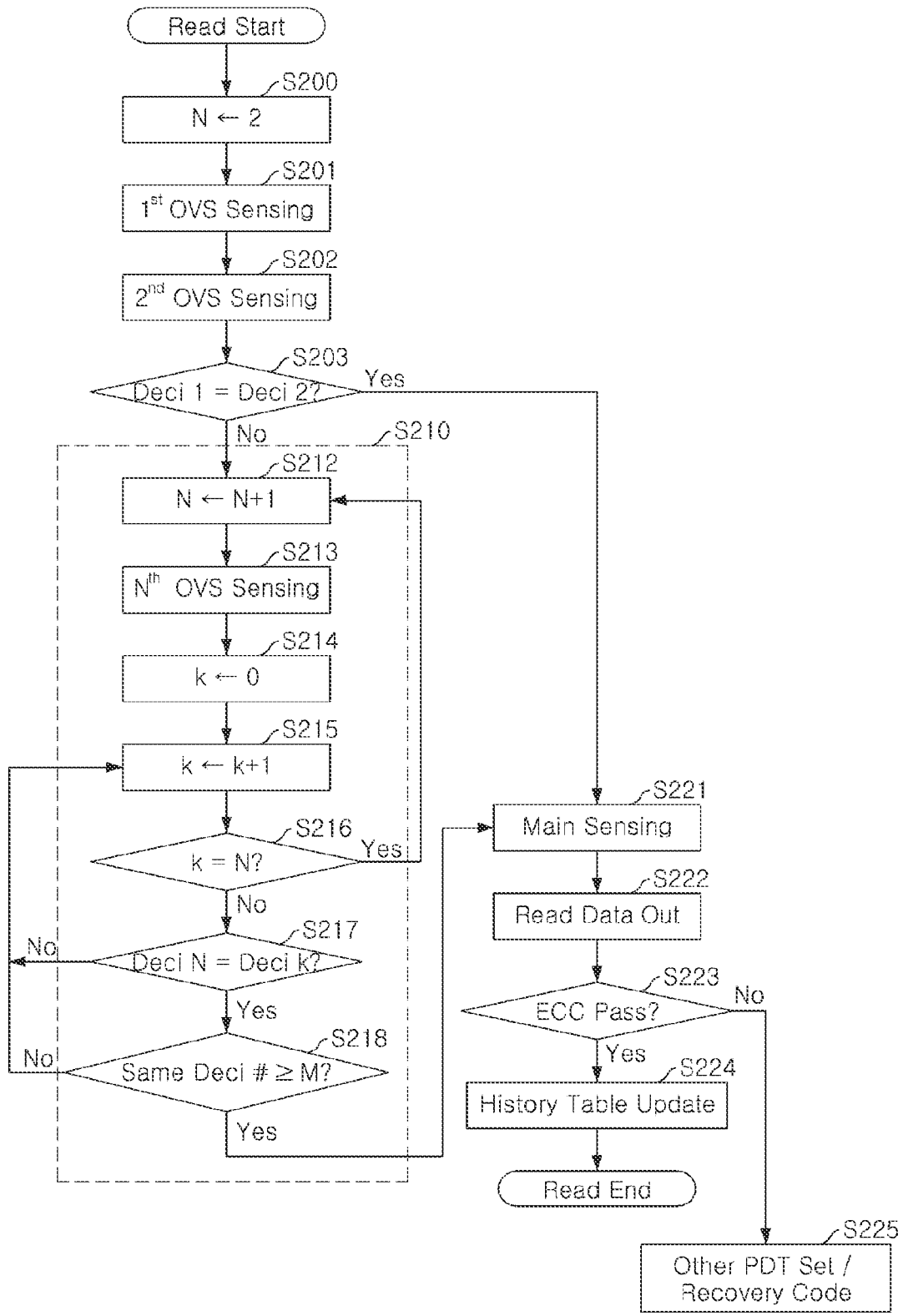
FIG. 10 illustrates a flowchart of a reading method for a storage device according to embodiments of the inventive concepts.

FIG. 10 illustrates a flowchart of a reading method for a storage device according to embodiments of the inventive concepts. Referring to FIGS. 1 to 10, a reading method for a storage device 10 may be performed as follows. In FIG. 10, the first, second, $N^{th}$ and $k^{th}$ determination values Deci 1, Deci 2, Deci N and Deci k may be cell counts provided from cell counter 170 shown in FIG. 2.

The number of OVS sensing times (N) may be set to 2 as a default (S200). A first OVS sensing operation is performed in response to an OVS command (S201). Then, a second OVS sensing operation is performed (S202). Thereafter, it is determined whether a first determination value Deci 1 of the first OVS sensing operation is identical to a second determination value Deci 2 of the second OVS sensing operation (S203).

When the first determination value Deci 1 is not identical to the second determination value Deci 2 (No at S203), the number of OVS sensing operations (N) is increased by 1 (S212). Then, an $N^{th}$ OVS sensing operation is performed (S213). Thereafter, k is set to 0 (S214), and then k is increased by 1 (S215). Then, it is determined whether N is equal to k (S216). When N is equal to k (Yes at S216), S212 is performed.

When N is not equal to k (No at S216), it is determined whether an $N^{th}$ determination value Deci N of the $N^{th}$ OVS sensing operation is identical to a $k^{th}$ determination value Deci k of a $k^{th}$ OVS sensing operation (S217). When the $N^{th}$ determination value Deci N is not identical to the $k^{th}$ OVS determination value Deci k (No at S217), S215 is performed. When the $N^{th}$ determination value Deci N is identical to the $k^{th}$ OVS determination value Deci k (Yes at S217), it is determined whether the number of cases in which the determination values Deci N and Deci k are the same is equal to or greater than M times (where M is an integer of 2 or more) (S218). When the number of cases in which the determination values Deci N and Deci k are the same is not equal to or greater than M times (No at S218), S215 is performed.

When the number of cases in which the determination values Deci N and Deci k are the same is equal to or greater than M times (Yes at S218), a main sensing operation is performed according to a case corresponding to a determination value (S221). In S203, when the first determination value Deci 1 is identical to the second determination value Deci 2, the main sensing operation is performed using a detection case corresponding to the first determination value Deci 1 of the first OVS sensing operation (S221). In FIG. 10, S210 as including S212 through S218 may for example be characterized as corresponding to the third OVS sensing operation shown generally in FIG. 9B repeated N times.

Thereafter, read data may be output to a controller 200 (refer to FIG. 1) (S222). Thereafter, the controller 200 may perform an error correction operation on the read data, and may determine whether error correction is possible (S223). When the error correction is possible (Yes at S223), history read table HRT 223 is updated (S224), and a read operation is ended. When error correction is impossible (No at S223), a different PDT set may be used or a different recovery code may be entered (S225).

A read operation according to embodiments of the inventive concepts may change a read level corresponding to a detection case after the OVS sensing operation, and a new OVS sensing operation may be then performed.

Figure 11A:
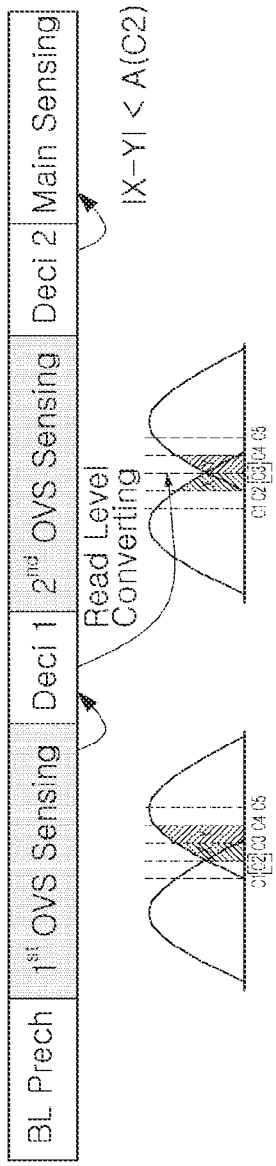
FIG. 11A illustrates a read operation using a multiple OVS sensing operation in which a difference value between a first count value X and a second count value Y in a second OVS sensing operation is less than a reference value A according to embodiments of the inventive concepts.
Figure 11B:
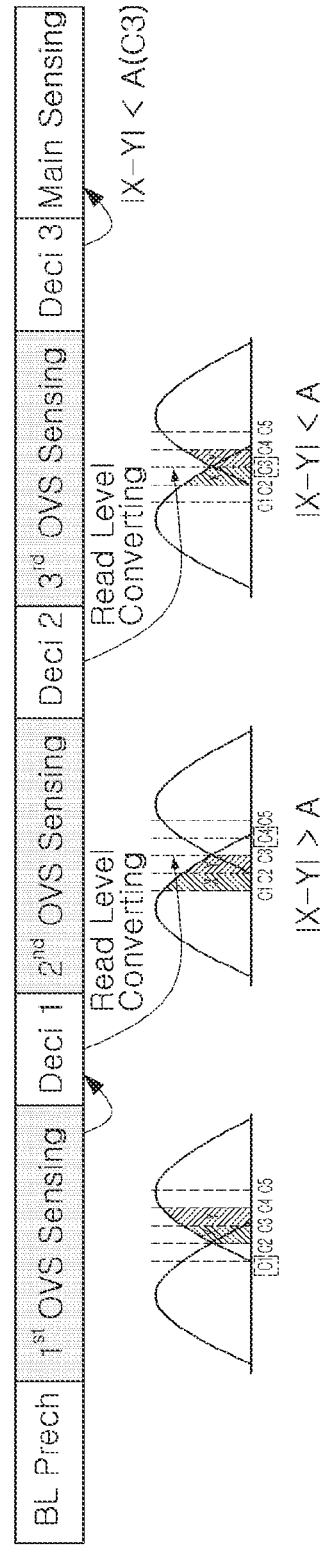
FIG. 11B illustrates a read operation using a multiple OVS sensing operation in which a difference value between a first count value X and a second count value Y in a second OVS sensing operation is greater than a reference value A according to embodiments of the inventive concepts.

FIGS. 11A and 11B illustrate a read operation using a multiple OVS sensing operation according to other embodiments of the inventive concepts.

FIG. 11A illustrates a case in which a difference value between a first count value X and a second count value Y in a second OVS sensing operation is less than a reference value A. The first count value X may be the number of memory cells between a read level and a level corresponding to the closest detection case below the read level, and the second count value Y may be the number of memory cells between a read level and a level corresponding to the closest detection case above the read level.

After a second case C2 corresponding to a determination value Deci 1 of a first OVS sensing operation is indicated in a first determination period, a read level for a second OVS sensing operation may be changed to a read level corresponding to the second case C2. Thereafter, the second OVS sensing operation may be performed using the changed read level. A determination value Deci 2 of the second OVS sensing operation may indicate a third case C3.

In a second determination period, it may be determined whether a difference value between a first count value X and a second count value Y in the second OVS sensing operation is less than the reference value A. When the difference between the first count value X and the second count value Y is less than the reference value A, a main sensing operation may be performed according to a detected case (e.g., C2).

FIG. 11B illustrates a case in which a difference value between a first count value X and a second count value Y in a second OVS sensing operation is greater than a reference value A. It is assumed that a first determination value Deci 1 may be determined as a first case C1, not a second case C2, as a situation in which sensing accuracy is deteriorated occurs in a first determination period. A read level for a second OVS sensing operation may be changed to a read level corresponding to the first case C1. Thereafter, the second OVS sensing operation may be performed using the changed read level. A determination value Deci 2 of the second OVS sensing operation may indicate a fourth case C4.

In a second determination period, it may be determined whether a difference value between a first count value X and a second count value Y in the second OVS sensing operation is greater than the reference value A. When the difference between the first count value X and the second count value Y is greater than the reference value A, a read level for a third OVS sensing operation may be again changed to a read level corresponding to the fourth case C4, which may be new. Thereafter, the third OVS sensing operation may be performed using the newly changed read level. The determination value Deci 3 of the third OVS sensing operation may indicate the third case C3. When the difference between the first count value X and the second count value Y is less than the reference value A, a main sensing operation may be performed according to a detected case (e.g., C3).

As described above, in an OVS sensing operation immediately after changing a read level, the OVS sensing operation will continue until a difference value between a first count value X and a second count value Y is less than a reference value A.

Figure 12:
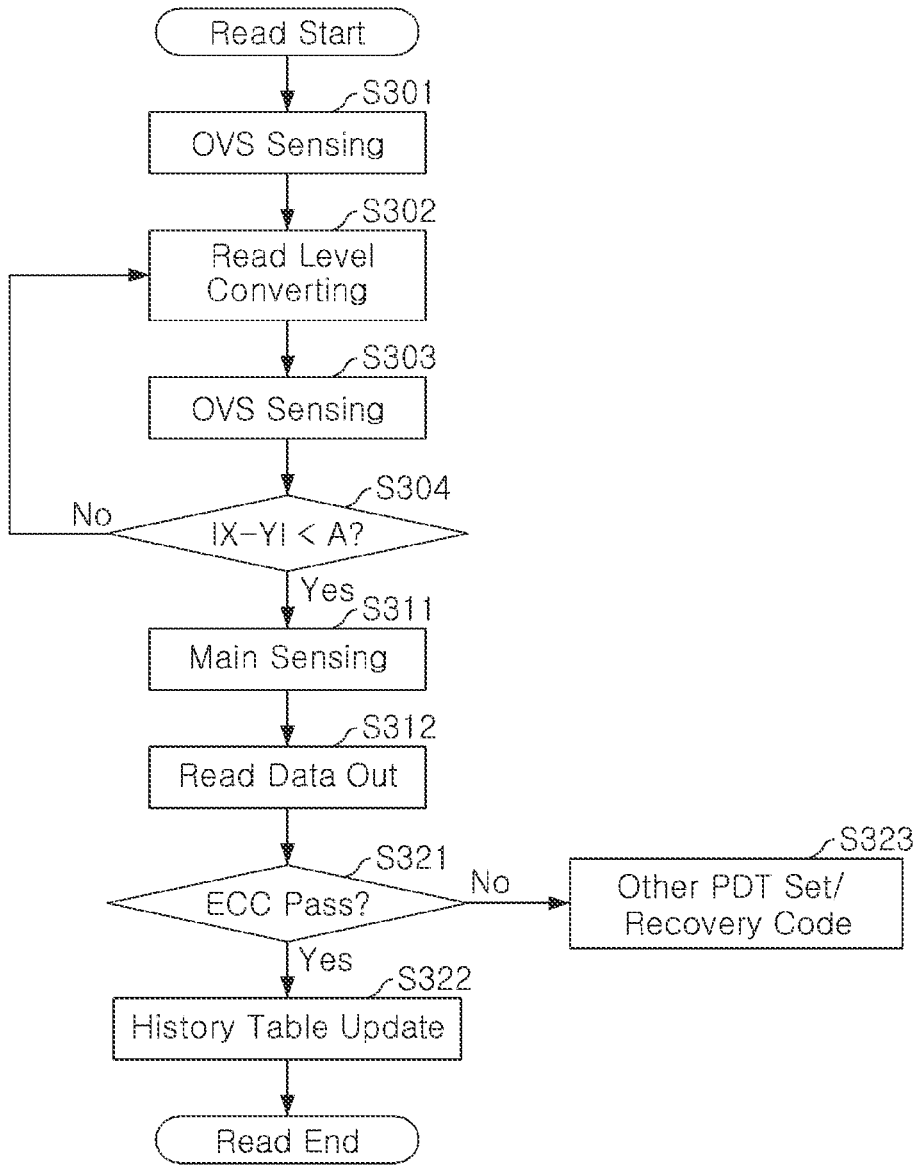
FIG. 12 illustrates a flowchart of a reading method for a non-volatile memory device according to embodiments of the inventive concepts.

FIG. 12 illustrates a flowchart of a reading method for a non-volatile memory device according to other embodiments of the inventive concepts. Referring to FIGS. 1 to 12, a read operation of a non-volatile memory device may be performed as follows.

An initial OVS sensing operation is performed in response to an OVS command (S301). A read level is changed according to the OVS sensing operation (S302). A new OVS sensing operation is performed using the changed read level (S303). Thereafter, in the new OVS sensing operation, it is determined whether a difference value between a first count value X and a second count value Y is less than a reference value A (S304). When the difference between the first count value X and the second count value Y is not less than the reference value A (No at S304), S302 is performed. When the difference between the first count value X and the second count value Y is less than the reference value A (Yes at S304), a main sensing operation is performed using a read level corresponding to a detection case (S311). Then, read data is output to a controller 200 (see FIG. 1) (S312). Thereafter, the controller 200 determines whether error correction for the read data is possible (S321). When error correction for the read data is possible (Yes at S321), history read table HRT 223 is updated (S322), and a read operation may be ended. When the read data are uncorrectable, a different PDT set or a different recovery code is entered (S323).

Figure 13A:
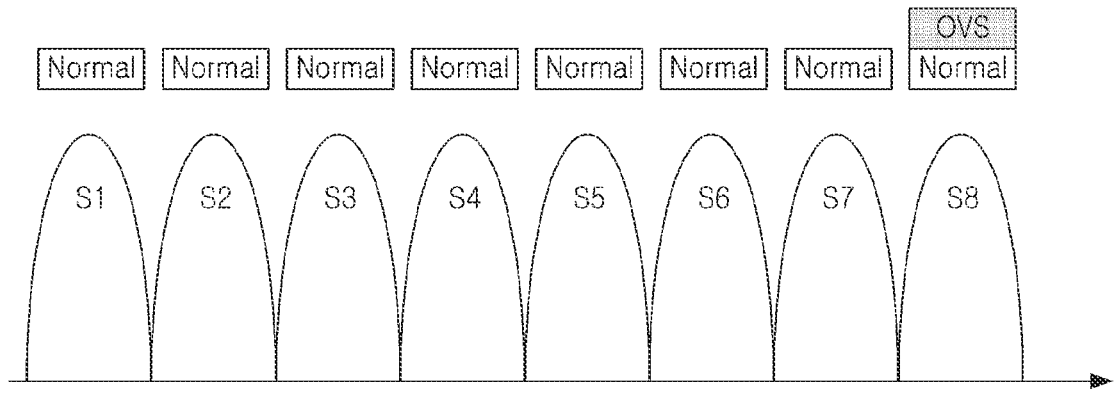
FIGS. 13A, 13B, and 13C illustrate distributions to which an OVS mode of a read operation according to embodiments of the inventive concepts is applied.

FIG. 13A illustrates ag distribution to which an OVS mode of a read operation according to embodiments of the inventive concepts is applied. Referring to FIG. 13A, an OVS sensing operation may be applied only to the highest state (e.g., S8). It should be understood that a state in which the OVS sensing operation is applied is not limited to the highest state S8.

Figure 13B:
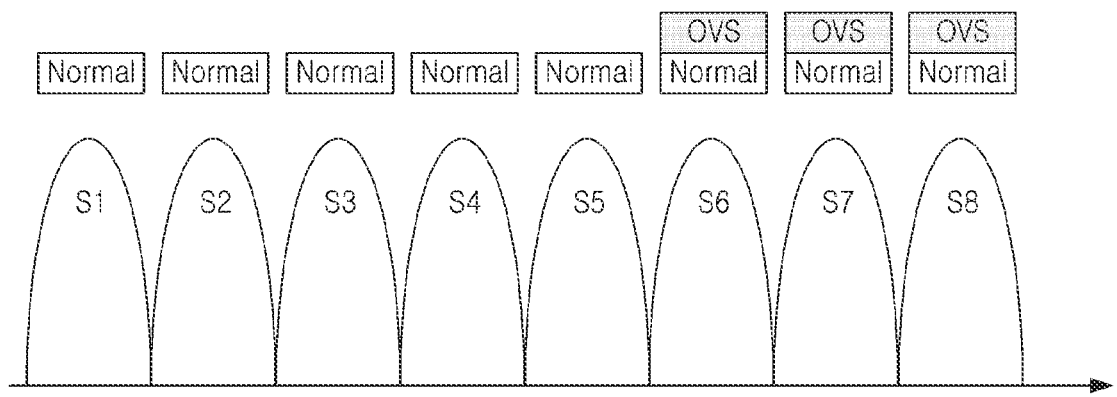

FIG. 13B illustrates a distribution to which an OVS mode of a read operation according to embodiments of the inventive concepts is applied. Referring to FIG. 13B, an OVS sensing operation may be applied to some of states (e.g., S6, S7, and S8). Although the number of states to which the OVS sensing operation illustrated in FIG. 13B is applied is 3, the inventive concepts are not limited thereto.

Figure 13C:
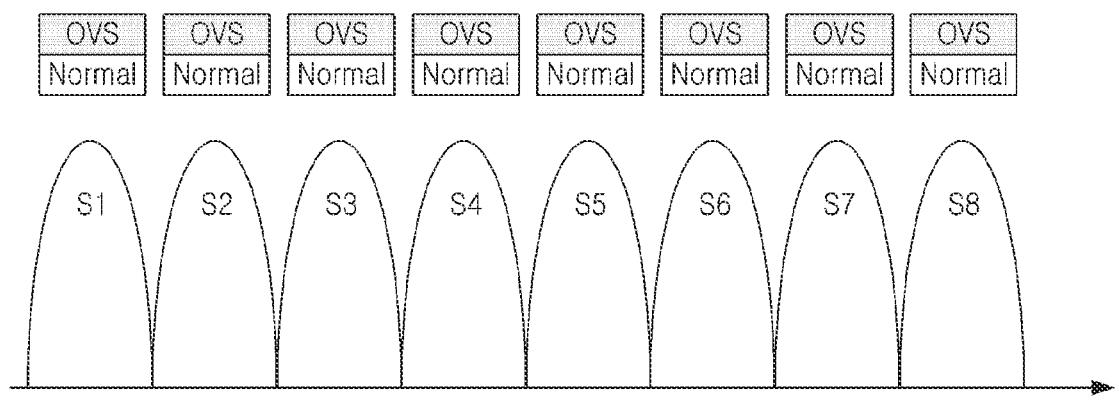

FIG. 13C illustrates a distribution to which an OVS mode of a read operation according to embodiment of the inventive concepts is applied. Referring to FIG. 13C, an OVS sensing operation may be applied to all states (e.g., S1 to S8).

FIGS. 13A, 13B, and 13C may refer to application of an OVS mode with respect to states of 3-bit memory cells (triple level cells: TLC). The inventive concepts need not be limited to 3-bit memory cells. For example, the inventive concepts may be used with quadruple level cells (QLCs). In such a case, an OVS mode may be applied to at least one state from among sixteen (16) states.

A non-volatile memory device of the inventive concepts may be implemented as having a multiple memory array tile (MAT) structure.

Figure 14:
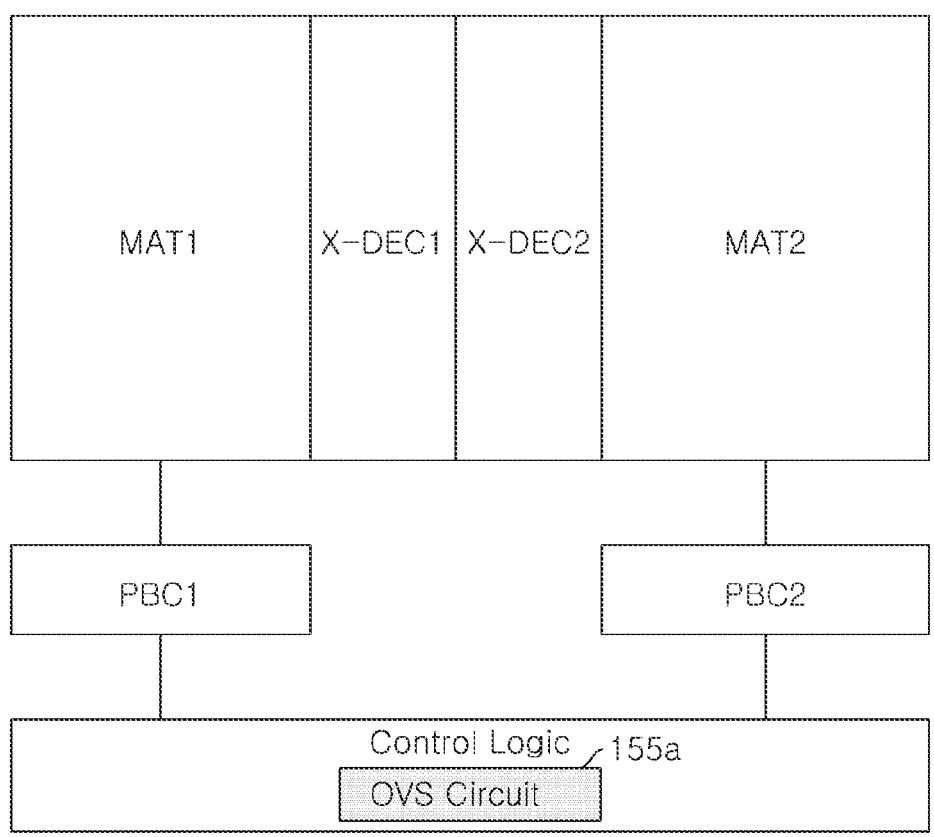
FIG. 14 illustrates a non-volatile memory device according to embodiments of the inventive concepts.

FIG. 14 illustrates a non-volatile memory device according to other embodiments of the inventive concepts. Referring to FIG. 14, the non-volatile memory device 100a may include a first MAT MAT1, a second MAT MAT2, a first row decoder X-DEC1, a second row decoder X-DEC2, a first page buffer circuit PBC1, a second page buffer circuit PBC2, and a control logic 155a. Each of the first and second MATs MAT1 and MAT2 may be implemented in the memory cell array 110 illustrated in FIG. 2 in the same manner, each of the first and second row decoders X-DEC1 and X-DEC2 may be implemented in the row decoder 120 illustrated in FIG. 2 in the same manner, and each of the first and second page buffer circuits PBC1 and PBC2 may be implemented in the page buffer circuit 130 illustrated in FIG. 2 in the same manner.

The control logic 155a may be implemented to simultaneously and independently perform a programming/reading/erasing operation on the first MAT MAT1 and a programming/reading/erasing operation on the second MAT MAT2.

Figure 15:
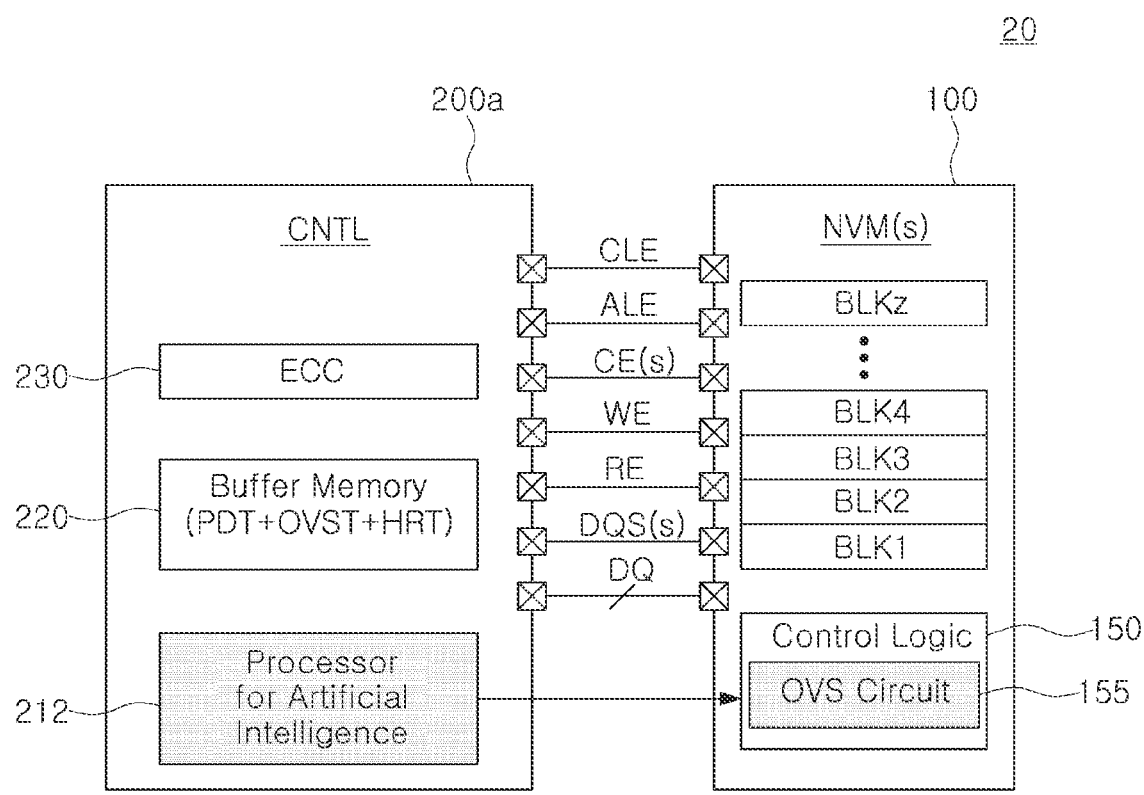
FIG. 15 illustrates a storage device according to embodiments of the inventive concepts.

FIG. 15 illustrates a storage device according to other embodiments of the inventive concepts.

Referring to FIG. 15, a non-volatile memory device 100 may include a user region and a meta region. The user region (not shown) may store user data, and may be implemented with a plurality of memory blocks such as shown in FIGS. 1 to 4. The meta region (not shown) may store management information for managing the non-volatile memory device 100 and may be implemented with at least one memory block such as shown in FIG. 2. The meta region need not be implemented with the same memory block as the user region.

The meta region may include a predefined table PDT and an OVS table. In this case, the predefined table PDT may store a value indicating a degree of change in a read voltage level over a program time. When a storage device 10 is initialized, the predefined table PDT and the OVS table of the meta region may be loaded into a buffer memory 220 (e.g., SRAM, DRAM, etc.) of a controller 200a. In an embodiment, the history read table HRT of the buffer memory 220 may be periodically or non-periodically updated in the meta region from the buffer memory 220.

The controller 200a may be connected to at least one non-volatile memory device 100 through a plurality of channels. The controller 200a may include a processor (not shown), a processor 212 for artificial intelligence, a buffer memory 220, and an error correction circuit 230.

The controller 200a may further include a timer (not shown) implemented in hardware/software/firmware. The timer may receive time-related information externally, and may generate/output a current time. For example, the timer may generate a current time by receiving a system clock and counting the system clock. In another embodiment, the timer may generate a current time by receiving time information externally and counting an internal clock. In this case, the internal clock may be generated from an oscillator inside the storage device 20.

At least one processor may be implemented to control an overall operation of the storage device 20. The processor may perform various management operations such as for example cache/buffer management, firmware management, garbage collection management, wear leveling management, data deduplication management, read refresh/reclaim management, bad block management, multi-stream management, mapping management of host data and non-volatile memory, quality-of-service (QoS) management, system resource allocation management, non-volatile memory queue management, read voltage level management, erase/program management, hot/cold data management, power loss protection management, dynamic thermal management, initialization management, redundant-array-of-inexpensive-disk (RAID) management, and the like.

In particular, the processor 212 for artificial intelligence may be implemented to improve reliability of data of the non-volatile memory device 100. In particular, as illustrated in FIGS. 1 to 14, when error correction is impossible in the error correction circuit 230, the processor 212 may be implemented to request a multiple OVS sensing operation, or manage an optimal history read level according to the multiple OVS sensing operation.

Figure 16:
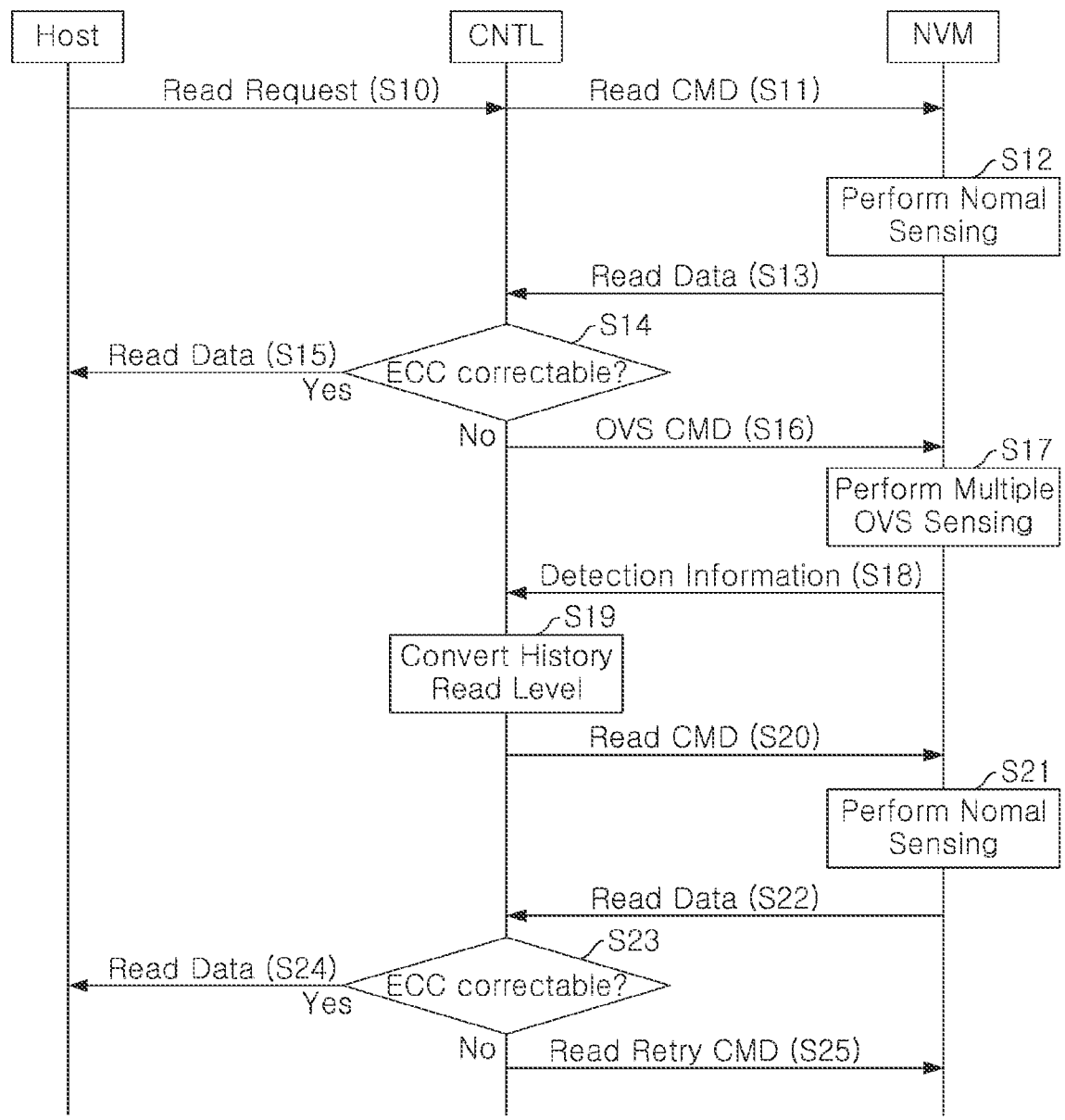
FIG. 16 illustrates a ladder diagram of a read operation of a storage device according to embodiments of the inventive concepts.

FIG. 16 illustrates a ladder diagram of a read operation of a storage device according to embodiments of the inventive concepts. Referring to FIGS. 1 and 16, a read operation of a storage device may be performed as follows.

A host transmits a read request, together with an address, to a storage device 10 (refer to FIG. 1) (S10). A controller 200 (refer to FIG. 1) of the storage device 10 receives the read request, searches a history buffer, determines whether to perform a history read operation or a normal read operation, and may transmit a normal/history read command in response to the determined operation to a non-volatile memory device (NVM 100, see FIG. 1) (S11). The non-volatile memory device 100 performs a normal sensing operation in response to the normal/history read command (S12), and transmits data read therefrom to the controller 200 (S13).

Thereafter, the controller 200 performs an error correction operation on the read data by an ECC circuit 230 (S14). When there is no error or error correction is possible (Yes at S14), the read data or the corrected data is transmitted to the host (S15).

When error correction is impossible (No at S14), the controller 200 enters a recovery code, and transmits an OVS command to the non-volatile memory device 100 (S16). The non-volatile memory device 100 performs a multiple OVS sensing operation in response to the OVS command (S17), and transmits detected case information to the controller 200 (S18).

The controller 200 uses the detected case information to change a history read level (S19). Thereafter, the controller 200 transmits a read command according to the changed history read level to the non-volatile memory device 100. The non-volatile memory device S21 uses the changed history read level to perform a normal sensing operation (S21), and transmits the read data to the controller 200 (S22).

Thereafter, the controller 200 performs an error correction operation on the read data by the ECC circuit 230 again (S23). When there is no error or error correction is possible (Yes at S23), the read data or the corrected data is transmitted to the host (S24). When there is error or error correction is not possible (No at S23), the controller 200 transmits a read retry command for reading data to the non-volatile memory device 100 in a different manner (S25).

A non-volatile memory device according to embodiments of the inventive concepts may be implemented in a chip-to-chip (C2C) structure.

Figure 17:
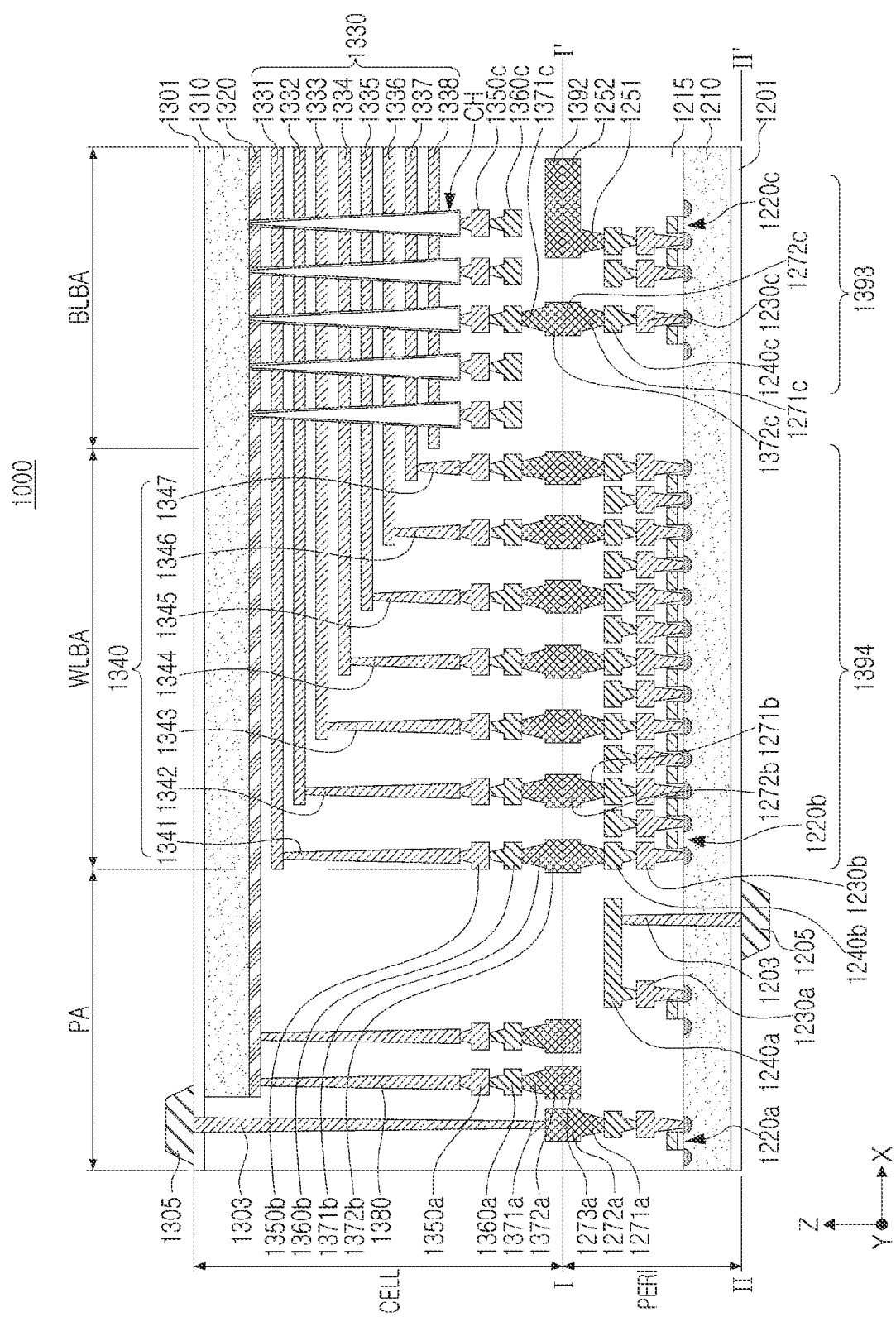
FIG. 17 illustrates a non-volatile memory device implemented in a C2C structure according to embodiments of the inventive concepts.

FIG. 17 illustrates a non-volatile memory device 1000 implemented in a C2C structure according to embodiments of the inventive concepts. In this case, the C2C structure may refer to a structure formed by manufacturing an upper chip including a cell region CELL on a first wafer, manufacturing a lower chip including a peripheral circuit region PERI on a second wafer, different from the first wafer, and then bonding the upper chip and the lower chip to each other in a bonding method. For example, the bonding method may be a method of electrically connecting a bonding metal formed on an uppermost metal layer of the upper chip, and a bonding metal formed on an uppermost metal layer of the lower chip. In an embodiment, when the bonding metals are formed of copper (Cu), the bonding method may be a Cu-to-Cu bonding method. In another embodiment, the bonding metals may also be formed of aluminum (Al) or tungsten (W).

Each of the peripheral circuit region PERI and the cell region CELL of the non-volatile memory device 1000 may include an external pad bonding area PA, a wordline bonding area WLBA, and a bitline bonding area BLBA.

The peripheral circuit region PERI may include a first substrate 1210, an interlayer insulation layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In an embodiment, the first metal layers 1230a, 1230b, and 1230c may be formed of tungsten having relatively high electrical resistivity. In an embodiment, the second metal layers 1240a, 1240b, and 1240c may be formed of copper having relatively low electrical resistivity.

As illustrated in FIG. 17, although only the first metal layers 1230a, 1230b, and 1230c and the second metal layers 1240a, 1240b, and 1240c are illustrated, the inventive concepts are not limited thereto. At least one metal layer may be further formed on the second metal layers 1240a, 1240b, and 1240c. At least a portion of the at least one metal layer formed on the second metal layers 1240a, 1240b, and 1240c may be formed of aluminum or the like having a lower electrical resistivity than those of copper forming the second metal layers 1240a, 1240b, and 1240c.

In an embodiment, the interlayer insulation layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an embodiment, the interlayer insulation layer 1215 may include an insulating material such as silicon oxide, silicon nitride, or the like.

Lower bonding metals 1271b and 1272b may be formed on the second metal layer 1240b in the wordline bonding area WLBA. In the wordline bonding area WLBA, the lower bonding metals 1271b and 1272b in the peripheral circuit region PERI may be electrically bonded to upper bonding metals 1371b and 1372b of the cell region CELL. In an embodiment, the lower bonding metals 1271b and 1272b and the upper bonding metals 1371b and 1372b may be formed of aluminum, copper, tungsten, or the like. In addition, the upper bonding metals 1371b and 1372b of the cell region CELL may be referred to as first metal pads, and the lower bonding metals 1271b and 1272b may be referred to as second metal pads.

The cell region CELL may include at least one memory block. The cell region CELL may include a second substrate 1310 and a common source line 1320. On the second substrate 1310, a plurality of wordlines 1331 to 1338 (i.e., 1330) may be stacked in a direction (a Z-axis direction), perpendicular to an upper surface of the second substrate 1310. String select lines and ground select lines may be arranged on and below the plurality of wordlines 1330, respectively, and the plurality of wordlines 1330 may be disposed between the string select lines and the ground select lines.

In the bitline bonding area BLBA, a channel structure CH may extend in the direction (the Z-axis direction), perpendicular to the upper surface of the second substrate 1310, and pass through the wordlines 1330, the string select lines, and the ground select lines. The channel structure CH may include a data storage layer, a channel layer, a buried insulation layer, and the like, and the channel layer may be electrically connected to a first metal layer 1350c and a second metal layer 1360c. For example, the first metal layer 1350c may be a bitline contact, and the second metal layer 1360c may be a bitline. In an embodiment, the bitline 1360c may extend in a first direction (a Y-axis direction), parallel to the upper surface of the second substrate 1310.

As illustrated in FIG. 17, an area in which the channel structure CH, the bitline 1360c, and the like are disposed may be defined as the bitline bonding area BLBA. In an embodiment, in the bitline bonding area BLBA, the bitline 1360c may be electrically connected to the circuit elements 1220c providing a page buffer 1393 in the peripheral circuit region PERI. For example, the bitline 1360c may be connected to upper bonding metals 1371c and 1372c in the peripheral circuit region PERI. In this case, the upper bonding metals 1371c and 1372c may be connected to lower bonding metals 1271c and 1272c connected to the circuit elements 1220c of the page buffer 1393. Also, upper metal pattern 1392 of the cell region CELL may be connected to lower metal pattern 1252 of the peripheral circuit region PERI, and lower bonding metal 1251 may be connected to lower metal pattern 1252. In the wordline bonding area WLBA, the wordlines 1330 may extend in a second direction (an X-axis direction), parallel to the upper surface of the second substrate 1310 and perpendicular to the first direction. In an embodiment, the wordline bonding area WLBA may be connected to a plurality of cell contact plugs 1341 to 1347 (i.e., 1340). For example, the wordlines 1330 and the cell contact plugs 1340 may be connected to each other in pads provided by at least a portion of the plurality of wordlines 1330 extending different lengths in the second direction. In an embodiment, a first metal layer 1350b and a second metal layer 1360b may be connected to an upper portion of the cell contact plugs 1340 connected to the wordlines 1330, sequentially. In an embodiment, the cell contact plugs 1340 may be connected to the peripheral circuit region PERI by the upper bonding metals 1371b and 1372b of the cell region CELL and the lower bonding metals 1271b and 1272b of the peripheral circuit region PERI in the wordline bonding area WLBA.

In an embodiment, the cell contact plugs 1340 may be electrically connected to the circuit elements 1220b forming a row decoder 1394 in the peripheral circuit region PERI. In an embodiment, operating voltages of the circuit elements 1220b of the row decoder 1394 may be different than operating voltages of the circuit elements 1220c forming the page buffer 1393. For example, operating voltages of the circuit elements 1220c forming the page buffer 1393 may be greater than operating voltages of the circuit elements 1220b forming the row decoder 1394.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350a and a second metal layer 1360a may be stacked on an upper portion of the common source line contact plug 1380, sequentially. For example, an area in which the common source line contact plug 1380, the first metal layer 1350a, and the second metal layer 1360a are disposed may be defined as the external pad bonding area PA. The second metal layer 1360a may be electrically connected to an upper metal via 1371a. The upper metal via 1371a may be electrically connected to an upper metal pattern 1372a.

Input/output pads 1205 and 1305 may be disposed in the external pad bonding area PA. Referring to FIG. 17, a lower insulating film 1201 covering a lower surface of the first substrate 1210 may be formed below the first substrate 1210, and a first input/output pad 1205 may be formed on the lower insulating film 1201. In an embodiment, the first input/output pad 1205 may be connected to at least one of the plurality of circuit elements 1220a, 1220b, and 1220c disposed in the peripheral circuit region PERI through a first input/output contact plug 1203. In an embodiment, the first input/output pad 1205 may be separated from the first substrate 1210 by the lower insulating film 1201. In addition, a side insulating film may be disposed between the first input/output contact plug 1203 and the first substrate 1210 to electrically separate the first input/output contact plug 1203 and the first substrate 1210.

Referring to FIG. 17, an upper insulating film 1301 covering the upper surface of the second substrate 1310 may be formed on the second substrate 1310. In addition, a second input/output pad 1305 may be disposed on the upper insulation layer 1301. In an embodiment, the second input/output pad 1305 may be connected to at least one of the plurality of circuit elements 1220a, 1220b, and 1220c disposed in the peripheral circuit region PERI through a second input/output contact plug 1303, a lower metal pattern 1272a, and a lower metal via 1271a.

In an embodiment, the second substrate 1310, the common source line 1320, and the like may not be disposed in an area in which the second input/output contact plug 1303 is disposed. Also, the second input/output pad 1305 may not overlap the wordlines 1380 in the third direction (the Z-axis direction). Referring to FIG. 17, the second input/output contact plug 1303 may be separated from the second substrate 1310 in a direction, parallel to the upper surface of the second substrate 1310. In addition, the second input/output contact plug 1303 may pass through the interlayer insulation layer 1315 of the cell region CELL to be connected to the second input/output pad 1305. In an embodiment, the second input/output pad 1305 may be electrically connected to the circuit element 1220a.

In an embodiment, the first input/output pad 1205 and the second input/output pad 1305 may be selectively formed. For example, the memory device 1000 may include only the first input/output pad 1205 disposed on the first substrate 1310 or the second input/output pad 1305 disposed on the second substrate 1310. In another embodiment, the non-volatile memory device 1000 may include both the first input/output pad 1205 and the second input/output pad 1305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the non-volatile memory device 1000 may include a lower metal pattern 1273a, corresponding to an upper metal pattern 1372a formed in an uppermost metal layer of the cell region CELL, and having the same cross-sectional shape as the upper metal pattern 1372a of the cell region CELL, to be connected to each other, in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, the upper metal pattern 1372a, corresponding to the lower metal pattern 1273a formed in an uppermost metal layer of the peripheral circuit region PERI, and having the same shape as the lower metal pattern 1273a of the peripheral circuit region PERI, may be formed in an uppermost metal layer of the cell region CELL.

In embodiments of the inventive concepts, the control logic 150 including the OVS circuit 155 as shown in FIGS. 1 and 2 and as described variously with reference to FIGS. 1-16, may be disposed in the peripheral circuit region PERI of the non-volatile memory device 1000 shown in FIG. 17.

A storage device according to embodiments of the inventive concepts may perform a normal sensing operation until error correction impossible (UECC) occurs, and may perform an OVS sensing operation for read retry after the UECC occurs. In this case, a final development time may be determined by comparing results of performing OVS sensing operations several times to reduce errors in OVS judgment due to noise. In an embodiment, results of N OVS sensing operations may be compared, it may be determined as a development time of a main sensing operation, when the number of cases in which determination values are the same is equal to or greater than M times. In an embodiment, OVS sensing conditions having the same state may be the same (WL Level, Develop Time).

A reading method for a storage device according to embodiments of the inventive concepts may perform a normal sensing operation before UECC occurs, and may perform an OVS sensing operation for read retry after the UECC occurs. In this case, the OVS sensing operation may be ended when an optimum read level is determined by performing the OVS sensing operation several times to reduce errors in OVS judgment due to noise.

In an embodiment, prior to an OVS sensing operation, a read level selected as a result of the OVS sensing operation may be performed again. When it is determined as not being an optimum read level, the above-described process may be repeated again. In an embodiment, an OVS sensing operation may be performed at least two times or more and at most N times.

In a non-volatile memory device according to embodiments of the inventive concepts, sensing operations and read times before and after UECC occurs may be different from each other. In an embodiment, a noise detection circuit may be provided, to shorten a development time to reduce the read time before the UECC occurs, and to lengthen a development time after the UECC occurs.

In an embodiment, a non-volatile memory device of the inventive concepts may perform one (1) OVS sensing operation once before UECC occurs and N OVS sensing operations after the UECC occurs. In addition, a non-volatile memory device of the inventive concepts may determine an OVS detection case with respect to detection cases of N OVS sensing operations by a majority voting method, to reduce errors in OVS judgment.

In an embodiment, a non-volatile memory device of the inventive concepts may perform an OVS operation using only a portion of page buffers, to reduce read times, before UECC occurs, and may perform the OVS operation N times using 1/N of page buffers after the UECC occurs, to average final OVS results or apply a majority voting method, to reduce errors in OVS judgment.

A non-volatile memory device, a storage device having the same, and a reading method thereof, according to embodiments of the inventive concepts, may perform a multiple OVS sensing operation to improve reliability of data in a noise situation.

While example embodiments have been illustrated and described above, it should be apparent to those skilled in the art that modifications and variations could be made without departing from the scope of the inventive concepts as defined by the appended claims.

What is claimed is:
1. A non-volatile memory device comprising:
a plurality of memory blocks, wherein each of the memory blocks includes at least two strings between respective bitlines and a common source line, wherein each of the at least two strings includes at least one string select transistor, a plurality of memory cells, and at least one ground select transistor connected in series between a bitline from among the bitlines and the common source line, and wherein the at least one string select transistor has a gate connected to a string select line, the plurality of memory cells receive a wordline voltage from wordlines, and the at least one ground select transistor has a gate connected to a ground select line; and a control logic circuit configured to perform a multiple on-chip valley search (OVS) sensing operation to identify states of the plurality of memory cells, wherein the multiple OVS sensing operation includes at least two OVS sensing operations with respect to memory cells from among the plurality of memory cells connected to a wordline from among the wordlines of a selected memory block from among the plurality of memory blocks in response to an address, during a read operation, and wherein the multiple OVS sensing operation comprises:
a first OVS sensing operation to determine a first detection case by performing a plurality of first sensing operations; and
a second OVS sensing operation to determine a second detection case by performing a plurality of second sensing operations.

2. The non-volatile memory device of claim 1, wherein each of the first OVS sensing operation and the second OVS sensing operation performs sensing operations using development times corresponding to different detection cases.

3. The non-volatile memory device of claim 1, wherein when the first detection case is identical to the second detection case, the control logic circuit is configured to perform main sensing using a read level or a development time corresponding to the first and second detection cases.

4. The non-volatile memory device of claim 1, wherein when the first detection case is different from the second detection case, the control logic circuit is configured to perform a plurality of third OVS sensing operations, determine a third detection case according to a result of the plurality of third OVS sensing operations, and perform main sensing using a read level or a development time corresponding to the third detection case.

5. The non-volatile memory device of claim 1, wherein the control logic circuit is configured to change a read level based on the first detection case of the first OVS sensing operation, and perform the second OVS sensing operation using the changed read level.

6. The non-volatile memory device of claim 5, wherein when a difference value between count values of the memory cells from among the plurality of memory cells corresponding to the second detection case is lower than a predetermined value, the control logic circuit is configured to determine the second detection case as a final detection case, and perform a main sensing using a read level or a development time corresponding to the determined second detection case.

7. The non-volatile memory device of claim 5, wherein when a difference value between count values of the memory cells from among the plurality of memory cells corresponding to the second detection case is higher than a predetermined value, the control logic circuit is configured to further change the changed read level according to the second detection case, and perform a third OVS sensing operation using the further changed read level.

8. The non-volatile memory device of claim 1, wherein the control logic circuit is configured to output detection case information corresponding to a detection case finally determined in the multiple OVS sensing operation to an external device.

9. The non-volatile memory device of claim 8, wherein the control logic circuit is configured to receive a history read level corresponding to the detection case information, and perform a normal read operation using the history read level.

10. A reading method for a non-volatile memory device including a plurality of memory cells and a control logic circuit, the reading method comprising:
performing, by the control logic circuit, a normal read operation on memory cells from among the plurality of memory cells using a default read level in response to a first read command; and
performing, by the control logic circuit, a read operation on the memory cells from among the plurality of memory cells using a multiple on-chip valley search (OVS) sensing operation in response to a second read command, when read data read from the memory cells from among the plurality of memory cells during the normal read operation are uncorrectable.

11. The reading method of claim 10, wherein the performing the read operation comprises:
performing a first OVS sensing operation having a plurality of first sensing operations using different development times;
determining a first detection case according to a result of the first OVS sensing operation;
performing a second OVS sensing operation having a plurality of second sensing operations using different development times; and
determining a second detection case according to a result of the second OVS sensing operation.

12. The reading method of claim 11, wherein the performing the read operation further comprises:
comparing the first detection case and the second detection case to provide a comparison result; and
determining whether to perform a main sensing operation or a further OVS sensing operation according to the comparison result.

13. The reading method of claim 10, wherein the performing the read operation comprises:
performing a first OVS sensing operation having a plurality of first sensing operations using the default read level and different development times;
determining a first detection case according to a result of the first OVS sensing operation;
changing the default read level according to the first detection case;
performing a second OVS sensing operation having a plurality of second sensing operations using the changed default read level and different development times; and
determining a second detection case according to a result of the second OVS sensing operation.

14. The reading method of claim 13, wherein the performing the read operation further comprises:
determining whether a difference value between count values corresponding to the second detection case is lower than a predetermined value to provide a comparison result; and
determining whether to perform a main sensing operation or a third OVS sensing operation according to the comparison result,
wherein, the third OVS sensing operation is performed using a read level changed according to the second detection case and different development times.

15. A storage device comprising:
at least one non-volatile memory device including a plurality of memory cells; and
a controller having control pins and configured to provide a command latch enable (CLE) signal, an address latch enable (ALE) signal, a chip enable (CE) signal, a write enable (WE) signal, a read enable (RE) signal, and a DQS signal to the at least one non-volatile memory device, and read data from memory cells from among the plurality of memory cells of the at least one non-volatile memory, wherein the at least one non-volatile memory device is configured to perform a multiple on-chip valley search (OVS) sensing operation on the memory cells from among the plurality of memory cells by latching an OVS command at an edge of the WE signal according to the CLE signal and the ALE signal, and output detection case information corresponding to the multiple OVS sensing operation to the controller.

16. The storage device of claim 15, wherein the controller further comprises an error correction code circuit configured to perform error correction of the data read from the memory cells from among the plurality of memory cells of the at least one non-volatile memory device, wherein the controller is configured to transmit the OVS command to the at least one non-volatile memory device when the data read from the memory cells from among the plurality of memory cells during a normal read operation by the error correction code circuit is uncorrectable.

17. The storage device of claim 16, wherein when the data read from the memory cells from among the plurality of memory cells during the normal read operation by the error correction code circuit are uncorrectable, the controller is configured to transmit a read retry command using a recovery code to the at least one non-volatile memory device.

18. The storage device of claim 16, wherein the controller is configured to update a history read table using the detection case information.

19. The storage device of claim 15, wherein the at least one non-volatile memory device comprises a control logic circuit, a first multiple array tile (MAT) and a second MAT, and the control logic circuit is configured to perform a first read operation on the first MAT and a second read operation on the second MAT that is independent from the first read operation on the first MAT.

* * * * *